United States Patent
Coolbaugh et al.

(10) Patent No.: US 11,435,523 B2
(45) Date of Patent: Sep. 6, 2022

(54) WAFER SCALE BONDED ACTIVE PHOTONICS INTERPOSER

(71) Applicant: The Research Foundation for The State University of New York, Albany, NY (US)

(72) Inventors: Douglas Coolbaugh, Albany, NY (US); Douglas La Tulipe, Albany, NY (US); Gerald Leake, Albany, NY (US)

(73) Assignee: THE RESEARCH FOUNDATION FOR THE STATE UNIVERSITY OF NEW YORK, Albany, NY (US)

( * ) Notice: Subject to any disclaimer, the term of this patent is extended or adjusted under 35 U.S.C. 154(b) by 0 days.

(21) Appl. No.: 16/909,557

(22) Filed: Jun. 23, 2020

(65) Prior Publication Data

US 2020/0319403 A1 Oct. 8, 2020

Related U.S. Application Data

(63) Continuation of application No. 15/891,847, filed on Feb. 8, 2018, now Pat. No. 10,698,156.
(Continued)

(51) Int. Cl.
  *G02B 6/12* (2006.01)
  *H01L 21/48* (2006.01)
  (Continued)

(52) U.S. Cl.
  CPC ......... *G02B 6/12002* (2013.01); *G02B 6/131* (2013.01); *G02B 6/4232* (2013.01);
  (Continued)

(58) Field of Classification Search
  None
  See application file for complete search history.

(56) References Cited

U.S. PATENT DOCUMENTS 5,841,931 A 11/1998 Foresi et al.
6,108,464 A 8/2000 Foresi et al.
(Continued)

FOREIGN PATENT DOCUMENTS

JP 2006-073653 3/2006
JP 2014-515559 6/2014
(Continued)

OTHER PUBLICATIONS

Yu, Mingbin, et al. "3D Electro-Optical Integration Based on High-Performance Si Photonics TSV Interposer." Optical Fiber Communication Conference, 2016, doi:10.1364/ofc.2016.th3j.3. (Year: 2016).*

(Continued)

*Primary Examiner* — J. E. Schoenholtz
(74) *Attorney, Agent, or Firm* — Heslin Rothenberg Farley & Mesiti P.C.

(57) ABSTRACT

There is set forth herein an optoelectrical system comprising: a conductive path for supplying an input voltage to a photonics device, wherein the conductive path comprises a base structure through via extending through a substrate and a photonics structure through via, the photonics structure through via extending through a photonics device dielectric stack. There is set forth herein an optoelectrical system comprising: a second structure fusion bonded to an interposer base dielectric stack of a first structure. There is set forth herein a method comprising: fabricating a second wafer built structure using a second wafer, the second wafer built structure defining a photonics structure and having a photonics device integrated into a photonics device dielectric stack of the second wafer based structure; and wafer scale bonding the second wafer built structure to a first wafer built structure.

21 Claims, 15 Drawing Sheets

Related U.S. Application Data

(60) Provisional application No. 62/490,665, filed on Apr. 27, 2017.

(51) Int. Cl.

| | | |
|---|---|---|
| *H01L 23/498* | (2006.01) | |
| *H01L 31/02* | (2006.01) | |
| *H01L 31/0232* | (2014.01) | |
| *G02B 6/13* | (2006.01) | |
| *G02B 6/42* | (2006.01) | |
| *H01L 23/00* | (2006.01) | |
| *G02B 6/43* | (2006.01) | |
| *H01L 27/12* | (2006.01) | |
| *H01L 21/18* | (2006.01) | |
| *H01L 21/762* | (2006.01) | |
| *H01L 25/18* | (2006.01) | |
| *H01L 25/00* | (2006.01) | |
| *H01L 25/065* | (2006.01) | |

(52) U.S. Cl.
CPC .............. *G02B 6/43* (2013.01); *H01L 21/187* (2013.01); *H01L 21/486* (2013.01); *H01L 23/49838* (2013.01); *H01L 24/92* (2013.01); *H01L 27/1266* (2013.01); *H01L 31/02002* (2013.01); *H01L 31/02016* (2013.01); *H01L 31/02327* (2013.01); *G02B 6/12* (2013.01); *G02B 6/12004* (2013.01); *G02B 2006/121* (2013.01); *G02B 2006/12038* (2013.01); *G02B 2006/12061* (2013.01); *G02B 2006/12138* (2013.01); *G02B 2006/12147* (2013.01); *G02B 2006/12176* (2013.01); *G02B 2006/12178* (2013.01); *H01L 21/7624* (2013.01); *H01L 21/76224* (2013.01); *H01L 23/49816* (2013.01); *H01L 23/49827* (2013.01); *H01L 24/08* (2013.01); *H01L 24/16* (2013.01); *H01L 24/24* (2013.01); *H01L 24/80* (2013.01); *H01L 24/81* (2013.01); *H01L 24/82* (2013.01); *H01L 25/0657* (2013.01); *H01L 25/18* (2013.01); *H01L 25/50* (2013.01); *H01L 27/1203* (2013.01); *H01L 2224/03002* (2013.01); *H01L 2224/0401* (2013.01); *H01L 2224/05008* (2013.01); *H01L 2224/05025* (2013.01); *H01L 2224/05582* (2013.01); *H01L 2224/08225* (2013.01); *H01L 2224/09181* (2013.01); *H01L 2224/11002* (2013.01); *H01L 2224/16145* (2013.01); *H01L 2224/24105* (2013.01); *H01L 2224/24226* (2013.01); *H01L 2224/73204* (2013.01); *H01L 2224/80896* (2013.01); *H01L 2224/81191* (2013.01); *H01L 2224/8203* (2013.01); *H01L 2224/9202* (2013.01); *H01L 2224/9222* (2013.01); *H01L 2224/94* (2013.01); *H01L 2225/06513* (2013.01); *H01L 2225/06541* (2013.01); *H01L 2924/0002* (2013.01); *H01L 2924/1431* (2013.01)

(56) References Cited

U.S. PATENT DOCUMENTS

| | | |
|---|---|---|
| 6,621,972 B2 | 9/2003 | Kimerling et al. |
| 6,631,225 B2 | 10/2003 | Lee et al. |
| 6,635,110 B1 | 10/2003 | Luan et al. |
| 6,690,871 B2 | 2/2004 | Lee et al. |
| 6,697,551 B2 | 2/2004 | Lee et al. |
| 6,812,495 B2 | 11/2004 | Wada et al. |
| 6,850,683 B2 | 2/2005 | Lee et al. |
| 6,879,014 B2 | 4/2005 | Wagner et al. |
| 6,884,636 B2 | 4/2005 | Fiorini et al. |
| 6,887,773 B2 | 5/2005 | Gunn, III et al. |
| 6,927,392 B2 | 8/2005 | Liddiard |
| 6,946,318 B2 | 9/2005 | Wada et al. |
| 7,008,813 B1 | 3/2006 | Lee et al. |
| 7,043,120 B2 | 5/2006 | Wada et al. |
| 7,075,081 B2 | 7/2006 | Fiorini et al. |
| 7,095,010 B2 | 8/2006 | Scherer et al. |
| 7,103,245 B2 | 9/2006 | Lee et al. |
| 7,123,805 B2 | 10/2006 | Sparacin et al. |
| 7,186,611 B2 | 3/2007 | Hsu et al. |
| 7,190,871 B2 | 3/2007 | Lock et al. |
| 7,194,166 B1 | 3/2007 | Gunn, III et al. |
| 7,251,386 B1 | 7/2007 | Dickinson et al. |
| 7,259,031 B1 | 8/2007 | Dickinson et al. |
| 7,262,117 B1 | 8/2007 | Gunn, III et al. |
| 7,266,263 B2 | 9/2007 | Ahn et al. |
| 7,279,682 B2 | 10/2007 | Ouvrier-Buffet et al. |
| 7,305,157 B2 | 12/2007 | Ahn et al. |
| 7,317,242 B2 | 1/2008 | Takizawa |
| 7,320,896 B2 | 1/2008 | Fiorini et al. |
| 7,321,713 B2 | 1/2008 | Akiyama et al. |
| 7,340,709 B1 | 3/2008 | Masini et al. |
| 7,358,527 B1 | 4/2008 | Masini et al. |
| 7,389,029 B2 | 6/2008 | Rahman et al. |
| 7,397,101 B1 | 7/2008 | Masini et al. |
| 7,424,181 B2 | 9/2008 | Haus et al. |
| 7,453,129 B2 | 11/2008 | King et al. |
| 7,453,132 B1 | 11/2008 | Gunn, III et al. |
| 7,459,686 B2 | 12/2008 | Syllaios et al. |
| 7,480,430 B2 | 1/2009 | Saini et al. |
| 7,508,050 B1 | 3/2009 | Pei et al. |
| 7,565,046 B2 | 7/2009 | Feng et al. |
| 7,613,369 B2 | 11/2009 | Witzens et al. |
| 7,616,904 B1 | 11/2009 | Gunn, III et al. |
| 7,651,880 B2 | 1/2010 | Tweet et al. |
| 7,659,627 B2 | 2/2010 | Miyachi et al. |
| 7,700,975 B2 | 4/2010 | Rakshit et al. |
| 7,723,206 B2 | 5/2010 | Miyachi et al. |
| 7,723,754 B2 | 5/2010 | Wada et al. |
| 7,736,734 B2 | 6/2010 | Carothers et al. |
| 7,737,534 B2 | 6/2010 | McLaughlin et al. |
| 7,754,540 B2 | 7/2010 | Vashchenko et al. |
| 7,767,499 B2 | 8/2010 | Herner |
| 7,773,836 B2 | 8/2010 | De Dobbelaere |
| 7,790,495 B2 | 9/2010 | Assefa et al. |
| 7,801,406 B2 | 9/2010 | Pan et al. |
| 7,812,404 B2 | 10/2010 | Herner et al. |
| 7,816,767 B2 | 10/2010 | Pei et al. |
| 7,831,123 B2 | 11/2010 | Sparacin et al. |
| 7,961,992 B2 | 1/2011 | De Dobbelaere et al. |
| 7,902,620 B2 | 3/2011 | Assefa et al. |
| 7,906,825 B2 | 3/2011 | Tweet et al. |
| 7,916,377 B2 | 3/2011 | Witzens et al. |
| 7,943,471 B1 | 5/2011 | Bauer et al. |
| 7,973,377 B2 | 7/2011 | King et al. |
| 7,994,066 B1 | 8/2011 | Capellini et al. |
| 7,999,344 B2 | 8/2011 | Assefa et al. |
| 8,030,668 B2 | 10/2011 | Hisamoto et al. |
| 8,121,447 B2 | 2/2012 | De Dobbelaere et al. |
| 8,165,431 B2 | 4/2012 | De Dobbelaere et al. |
| 8,168,939 B2 | 5/2012 | Mack et al. |
| 8,178,382 B2 | 5/2012 | Assefa et al. |
| 8,188,512 B2 | 5/2012 | Kim et al. |
| 8,227,787 B2 | 7/2012 | Kumar et al. |
| 8,238,014 B2 | 8/2012 | Kucharski et al. |
| 8,289,067 B2 | 10/2012 | Kucharski et al. |
| 8,304,272 B2 | 11/2012 | Assefa et al. |
| 8,343,792 B2 | 1/2013 | Carothers et al. |
| 8,354,282 B2 | 1/2013 | Stern |
| 8,358,940 B2 | 1/2013 | Kucharski et al. |
| 8,399,949 B2 | 3/2013 | Meade |
| 8,440,989 B2 | 5/2013 | Mack et al. |
| 8,455,292 B2 | 6/2013 | Assefa et al. |
| 8,471,639 B2 | 6/2013 | Welch |
| 8,577,191 B2 | 11/2013 | De Dobbelaere et al. |
| 8,592,745 B2 | 11/2013 | Masini et al. |
| 8,604,866 B2 | 12/2013 | Kucharski et al. |
| 8,614,116 B2 | 12/2013 | Assefa et al. |
| 8,625,935 B2 | 1/2014 | Mekis et al. |

(56) References Cited

U.S. PATENT DOCUMENTS

| | | | |
|---|---|---|---|
| 8,626,002 B2 | 1/2014 | Kucharski et al. | |
| 8,633,067 B2 | 1/2014 | Assefa et al. | |
| 8,649,639 B2 | 2/2014 | Mekis et al. | |
| 8,664,739 B2 | 3/2014 | King et al. | |
| 8,665,508 B2 | 3/2014 | Kucharski et al. | |
| RE44,829 E | 4/2014 | De Dobbelaere et al. | |
| 8,698,271 B2 | 4/2014 | Suh et al. | |
| 8,742,398 B2 | 6/2014 | Klem et al. | |
| 8,754,711 B2 | 6/2014 | Welch | |
| 8,772,704 B2 | 7/2014 | Mack et al. | |
| 8,787,774 B2 | 7/2014 | Guckenberger | |
| 8,798,476 B2 | 8/2014 | Gloeckner et al. | |
| RE45,214 E | 10/2014 | De Dobbelaere et al. | |
| RE45,215 E | 10/2014 | De Dobbelaere et al. | |
| 8,877,616 B2 | 11/2014 | Pinguet et al. | |
| 8,895,413 B2 | 11/2014 | Pinguet et al. | |
| 8,923,664 B2 | 12/2014 | Mekis et al. | |
| RE45,390 E | 2/2015 | De Dobbelaere et al. | |
| 9,046,650 B2 | 6/2015 | Lin et al. | |
| 9,053,980 B2 | 6/2015 | Pinguet et al. | |
| 9,091,827 B2 | 7/2015 | Verslegers et al. | |
| 9,110,221 B2 | 8/2015 | Agarwal et al. | |
| 9,478,504 B1 | 10/2016 | Shen et al. | |
| 9,748,167 B1 | 8/2017 | Lin | |
| 9,864,133 B2* | 1/2018 | Patel | G02B 6/4291 |
| 9,874,693 B2 | 1/2018 | Baiocco et al. | |
| 9,881,904 B2* | 1/2018 | Das | H01L 23/535 |
| 10,698,156 B2* | 6/2020 | Coolbaugh | H01L 31/02002 |
| 2002/0076874 A1 | 6/2002 | Coolbaugh et al. | |
| 2003/0215203 A1 | 11/2003 | Lock et al. | |
| 2005/0012040 A1 | 1/2005 | Fiorini et al. | |
| 2005/0051705 A1 | 3/2005 | Yasaitis | |
| 2005/0101084 A1 | 5/2005 | Gilton | |
| 2005/0205954 A1 | 9/2005 | King et al. | |
| 2006/0110844 A1 | 5/2006 | Lee et al. | |
| 2006/0194357 A1 | 8/2006 | Hsu et al. | |
| 2006/0243973 A1 | 11/2006 | Gilton | |
| 2006/0249753 A1 | 11/2006 | Herner | |
| 2006/0250836 A1 | 11/2006 | Herner et al. | |
| 2006/0250837 A1 | 11/2006 | Herner | |
| 2006/0289764 A1 | 12/2006 | Fiorini et al. | |
| 2007/0034978 A1 | 2/2007 | Pralle et al. | |
| 2007/0099329 A1 | 5/2007 | Maa et al. | |
| 2007/0104410 A1 | 5/2007 | Ahn et al. | |
| 2007/0141744 A1 | 6/2007 | Lee et al. | |
| 2007/0170536 A1 | 7/2007 | Hsu et al. | |
| 2007/0190722 A1 | 8/2007 | Herner | |
| 2007/0228414 A1 | 10/2007 | Kumar et al. | |
| 2007/0246764 A1 | 10/2007 | Herner | |
| 2007/0262296 A1 | 11/2007 | Bauer | |
| 2008/0121805 A1 | 5/2008 | Tweet et al. | |
| 2008/0157253 A1 | 7/2008 | Starikov et al. | |
| 2008/0217651 A1 | 9/2008 | Liu et al. | |
| 2008/0239787 A1 | 10/2008 | Herner | |
| 2008/0311696 A1 | 12/2008 | Chee-Wee et al. | |
| 2008/0316795 A1 | 12/2008 | Herner | |
| 2008/0318397 A1 | 12/2008 | Herner | |
| 2009/0032814 A1 | 2/2009 | Vashchenko et al. | |
| 2009/0196631 A1 | 8/2009 | Daghighian et al. | |
| 2009/0294814 A1* | 12/2009 | Assefa | H01L 25/167 |
| | | | 257/292 |
| 2010/0006961 A1 | 1/2010 | Yasaitis | |
| 2010/0031992 A1 | 2/2010 | Hsu | |
| 2010/0090110 A1 | 4/2010 | Tweet et al. | |
| 2010/0102412 A1 | 4/2010 | Suh et al. | |
| 2010/0133536 A1 | 6/2010 | Syllaios et al. | |
| 2010/0133585 A1 | 6/2010 | Kim et al. | |
| 2010/0151619 A1 | 6/2010 | Yasaitis | |
| 2010/0213561 A1 | 8/2010 | Assefa et al. | |
| 2010/0276776 A1 | 11/2010 | Lee et al. | |
| 2010/0302836 A1 | 12/2010 | Herner | |
| 2011/0012221 A1 | 1/2011 | Fukikata et al. | |
| 2011/0027950 A1 | 2/2011 | Jones et al. | |
| 2011/0156183 A1 | 6/2011 | Liu | |
| 2011/0163404 A1 | 7/2011 | Lee et al. | |
| 2011/0227116 A1 | 9/2011 | Saito et al. | |
| 2012/0001283 A1 | 1/2012 | Assefa et al. | |
| 2012/0025212 A1 | 2/2012 | Kouvetakis et al. | |
| 2012/0129302 A1 | 5/2012 | Assefa et al. | |
| 2012/0177381 A1 | 7/2012 | Dobbelaere et al. | |
| 2012/0187280 A1 | 7/2012 | Kerness et al. | |
| 2012/0193636 A1 | 8/2012 | Stern | |
| 2012/0288971 A1 | 11/2012 | Boagaerts et al. | |
| 2012/0288992 A1 | 11/2012 | Assefa et al. | |
| 2012/0299143 A1 | 11/2012 | Stern | |
| 2013/0065349 A1 | 3/2013 | Assefa et al. | |
| 2013/0154042 A1 | 6/2013 | Meade | |
| 2013/0202005 A1 | 8/2013 | Dutt | |
| 2013/0214160 A1 | 8/2013 | Cazaux et al. | |
| 2013/0228886 A1 | 9/2013 | JangJian et al. | |
| 2013/0284889 A1 | 10/2013 | Giffard et al. | |
| 2013/0313579 A1 | 11/2013 | Kouvetakis et al. | |
| 2013/0328145 A1 | 12/2013 | Liu et al. | |
| 2014/0008750 A1 | 1/2014 | Feshali et al. | |
| 2014/0027826 A1 | 1/2014 | Assefa et al. | |
| 2014/0029892 A1 | 1/2014 | Pomerene et al. | |
| 2014/0080269 A1 | 3/2014 | Assefa et al. | |
| 2014/0124669 A1 | 5/2014 | Zheng et al. | |
| 2014/0131733 A1 | 5/2014 | Meade | |
| 2014/0134789 A1 | 5/2014 | Assefa et al. | |
| 2014/0134790 A1 | 5/2014 | Assefa et al. | |
| 2014/0159129 A1 | 6/2014 | Wang et al. | |
| 2014/0175510 A1 | 6/2014 | Suh et al. | |
| 2014/0203325 A1 | 7/2014 | Verma et al. | |
| 2014/0209985 A1 | 7/2014 | Assefa et al. | |
| 2014/0269804 A1 | 9/2014 | Lai et al. | |
| 2014/0321804 A1 | 10/2014 | Thacker et al. | |
| 2015/0010266 A1* | 1/2015 | Webster | G02B 6/1228 |
| | | | 385/14 |
| 2015/0219850 A1 | 8/2015 | Fish et al. | |
| 2016/0197111 A1 | 7/2016 | Coolbaugh et al. | |
| 2016/0223749 A1 | 8/2016 | Coolbaugh et al. | |
| 2016/0266322 A1 | 9/2016 | Epitaux et al. | |
| 2017/0047312 A1* | 2/2017 | Budd | H01L 25/117 |
| 2018/0143374 A1 | 5/2018 | Coolbaugh et al. | |
| 2018/0240736 A1 | 8/2018 | Liu et al. | |
| 2018/0314003 A1 | 11/2018 | Coolbaugh et al. | |
| 2019/0025513 A1 | 1/2019 | Coolbaugh et al. | |

FOREIGN PATENT DOCUMENTS

| | | |
|---|---|---|
| TW | 1495064 B | 8/2015 |
| WO | 2016050243 A1 | 4/2016 |
| WO | WO 2017050243 A1 | 4/2016 |

OTHER PUBLICATIONS

Eibelhuber, E., "Advanced bonding techniques for photonic integrated circuits", CS Mantech Conference, May 19-22, 2014, Denver, Colorado. (Year: 2014).*

Ho, S. W., et al. "2.5D Through Silicon Interposer Package Fabrication by Chip-on-Wafer (CoW) Approach." 2014 IEEE 16th Electronics Packaging Technology Conference (EPTC), 2014, doi:10.1109/eptc.2014.7028352. (Year: 2014).*

'AIM Photonics announces best-in-class 300mm silicon photonics MPW performance', Semiconductor Today, Feb. 6, 2019. (Year: 2019).*

Office Action in Chinese Application No. 201880030723.2 with translation. Dated Mar. 3, 2021.

AIM Photonics Management Team downloaded on Jun. 5, 2019 from URL http://www.almphotonics.com/magagement-team, (Year: 2019).

Fedeli et al., "Electronic-Photonic Integration in the Helios Project", 10$^{th}$ International Conference on Group IV Photonics, Aug. 28-30, 2013, pp. 146-147.

Garnier et al., "Results on Aligned SiO$_2$ Direct Wafer-to-Wafer Low Temperature Bonding for 3D Integration", 2009 IEEE International SOI Conference, 2009, doi:10.1109/soi.2009.5318753.

Ghaffarian, R., "Book of Knowledge (BOK) for NASA Electronic Packaging Roadmap", JPL Publication 15, Feb. 4, 2015 (Year: 2015).

(56) References Cited

OTHER PUBLICATIONS

Plach et al., "Plasma Activation for Low Temperature Wafer Bonding", ECS Transactions, 2008, doi:10.1149/1.2982910.
Semiconductor Packaging and Assembly 2002 Review and Outlook, Garner Dataquest, Inc., 2002 (Year: 2002).
Semiconductor Back-End Subcontractors, EESemi.com, (2004), downloaded on Jun. 5, 2019 from URL http://www.eesemi.com/subcons.htm (Year: 2004).
Chen et al., "Wafter-Scale 3D Integration of InGaAs Image Sensors with Si Readout Circuits", 3D System Integration, IEEE International Conference On, IEEE, Piscataway NJ, ISBN 9781-4244-4511-0, Sep. 28, 2009.
Fan et al., "Low Temperature Wafer-Level Metal Thermo-Compression Bonding Technology for 3D Integration", Metallurgy—Advanced in Materials and Processes, ISBN 978-953-51-0736-1, Sep. 19, 2012.
Yu et al., "3D Electro-Optical Integration Based on High-Performance Si Photonics TSV Interposer", 2016 Optical Fiber Communications Conference and Exhibition (OFC), Mar. 20-24, 2016, pp. 1-3.
Mingbin et al., "3D Electro-Optical Integration Based on High-Performance Si Photonics TSV Interposer", 2016 Optical Fiber Communications Conference and Exhibition (OFC), OSA, XP032942514, Mar. 20, 2016.
International Search Report (ISR) for International Application No. PCT/US2018/017558, filed Feb. 9, 2018, dated May 7, 2018.
Written Opinion of the International Searching Authority for International Application No. PCT/US2018/017558, filed Feb. 9, 2018, dated May 7, 2018.
TW Office Action for TW Application No. 107107158, filed Mar. 5, 2018, dated Oct. 16, 2019.
TW Search Report for TW Application No. 107107158, filed Mar. 5, 2018, dated Oct. 16, 2019.
Office Action in Japanese Application No. 2019-558769 with translation, dated Mar. 1, 2022.
Office Action in European Application No. 18706623.8, dated May 23, 2022.
Yu et al., "3D Electro-Optical Integration Based on High-Performance Si Photonics TSV Interposer", Optical Society of America, 3 pages, Mar. 20, 2016.
Chen et al., "Wafer-Scale 3D Integration of InGaAs Image Sensors with Si Readout Circuits", 3D System Integration, IEEE International Conference, 4 pages, Sep. 28, 2009.
Fan et al., "Low Temperature Wafer-Level Metal Thermo-Compressioni Bonding Technology for 3D Integration", Metallurgy—Advances in Materials and Processes, 24 pages, Sep. 19, 2012.
Fedeli et al., "Electronic-Photonic Integration in the Helios Project", 10th International Conference on Group IV Photonics, IEEE, 2 pages, Aug. 28, 2013.

\* cited by examiner

WAFER SCALE BONDED ACTIVE PHOTONICS INTERPOSER

CROSS REFERENCE TO RELATED APPLICATIONS

This application is a continuation of U.S. patent application Ser. No. 15/891,847, filed Feb. 8, 2018, entitled, "Wafer Scale Bonded Active Photonics Interposer", which is incorporated by reference herein in its entirety, which claims the benefit of priority of U.S. Provisional Application No. 62/490,665 filed Apr. 27, 2017 entitled "Wafer Scale Bonded Active Photonics Interposer" which is incorporated by reference herein in its entirety.

GOVERNMENT RIGHTS STATEMENT

This invention was made with government support under the Department of Defense (DOD) of the United States, under grant contract number FA8650-15-2-5220. The government may have certain rights in the invention.

FIELD

The present disclosure relates to photonics generally and specifically to photonics structures and processes for fabrication.

BACKGROUND

Commercially available photonics integrated circuits are fabricated on wafers, such as bulk silicon or silicon-on-insulator wafers. Commercially available prefabricated photonics integrated circuit chips can include waveguides for transmission of optical signals between different areas of a prefabricated photonics integrated circuit chip. Commercially available waveguides are of rectangular or ridge geometry and are fabricated in silicon (single or polycrystalline) or silicon nitride. Commercially available photonics integrated circuit chips are available on systems having a photonics integrated circuit chip disposed on a printed circuit board.

BRIEF DESCRIPTION

The shortcomings of the prior art are overcome, and additional advantages are provided, through the provision, in one aspect, of a photonics structure.

There is set forth herein an optoelectrical system comprising: a first structure defining an interposer base structure and having a substrate, an interposer base dielectric stack and interposer base structure through vias extending through the substrate; a second structure defining a photonics structure and having a photonics device integrated into a photonics device dielectric stack of the second structure, wherein the second structure is bonded to the interposer base dielectric stack of the first structure; and a conductive path for supplying an input voltage to the photonics device, wherein the conductive path comprises a base structure through via of the interposer base structure through vias extending through the substrate and a photonics structure through via of the second structure, the photonics structure through via extending through the photonics device dielectric stack of the second structure.

There is set forth herein an optoelectrical system comprising: a first structure defining an interposer base structure and having an interposer base dielectric stack and a plurality of interposer base structure through vias, wherein the interposer base structure through vias extend through a substrate of the interposer base structure; a second structure having a photonics device integrated into a photonics device dielectric stack of the second structure, and further having a photonics structure through via extending through the photonics device dielectric stack; and wherein the second structure is fusion bonded to the interposer base dielectric stack of the first structure.

There is set forth herein a method comprising: fabricating a first wafer built structure using a first wafer, the first wafer built structure defining an interposer base structure and having a plurality of interposer base structure through vias; fabricating a second wafer built structure using a second wafer, the second wafer built structure defining a photonics structure and having a photonics device integrated into a photonics device dielectric stack of the second wafer based structure; and wafer scale bonding the second wafer built structure to the first wafer built structure.

There is set forth herein a method including building an interposer base structure on a first wafer, wherein the building an interposer base structure includes fabricating a plurality of through vias that extend through a substrate and fabricating within an interposer base dielectric stack one or more metallization layer; building a photonics structure on a second wafer, wherein the building a photonics structure includes fabricating within a photonics device dielectric stack one or more photonics device; and bonding the photonics structure to the interposer base structure to define an interposer having the interposer base structure and one or more photonics device.

There is set forth herein an optoelectrical system including a substrate; an interposer dielectric stack formed on the substrate, the interposer dielectric stack including a base interposer dielectric stack, and a photonics device dielectric stack, and a bond layer dielectric stack that integrally bonds the photonics device dielectric stack to the base interposer dielectric stack.

Additional features and advantages are realized through the techniques of the present disclosure.

BRIEF DESCRIPTION OF THE SEVERAL VIEWS OF THE DRAWINGS

One or more aspects of the present disclosure are particularly pointed out and distinctly claimed as examples in the claims at the conclusion of the specification. The foregoing and other objects, features, and advantages of the disclosure are apparent from the following detailed description taken in conjunction with the accompanying drawings in which:

DETAILED DESCRIPTION

Aspects of the present disclosure and certain features, advantages, and details thereof, are explained more fully below with reference to the non-limiting examples illustrated in the accompanying drawings. Descriptions of well-known materials, fabrication tools, processing techniques, etc., are omitted so as not to unnecessarily obscure the disclosure in detail. It should be understood, however, that the detailed description and the specific examples, while indicating aspects of the disclosure, are given by way of illustration only, and not by way of limitation. Various substitutions, modifications, additions, and/or arrangements, within the spirit and/or scope of the underlying inventive concepts will be apparent to those skilled in the art from this disclosure.

Figure 1:
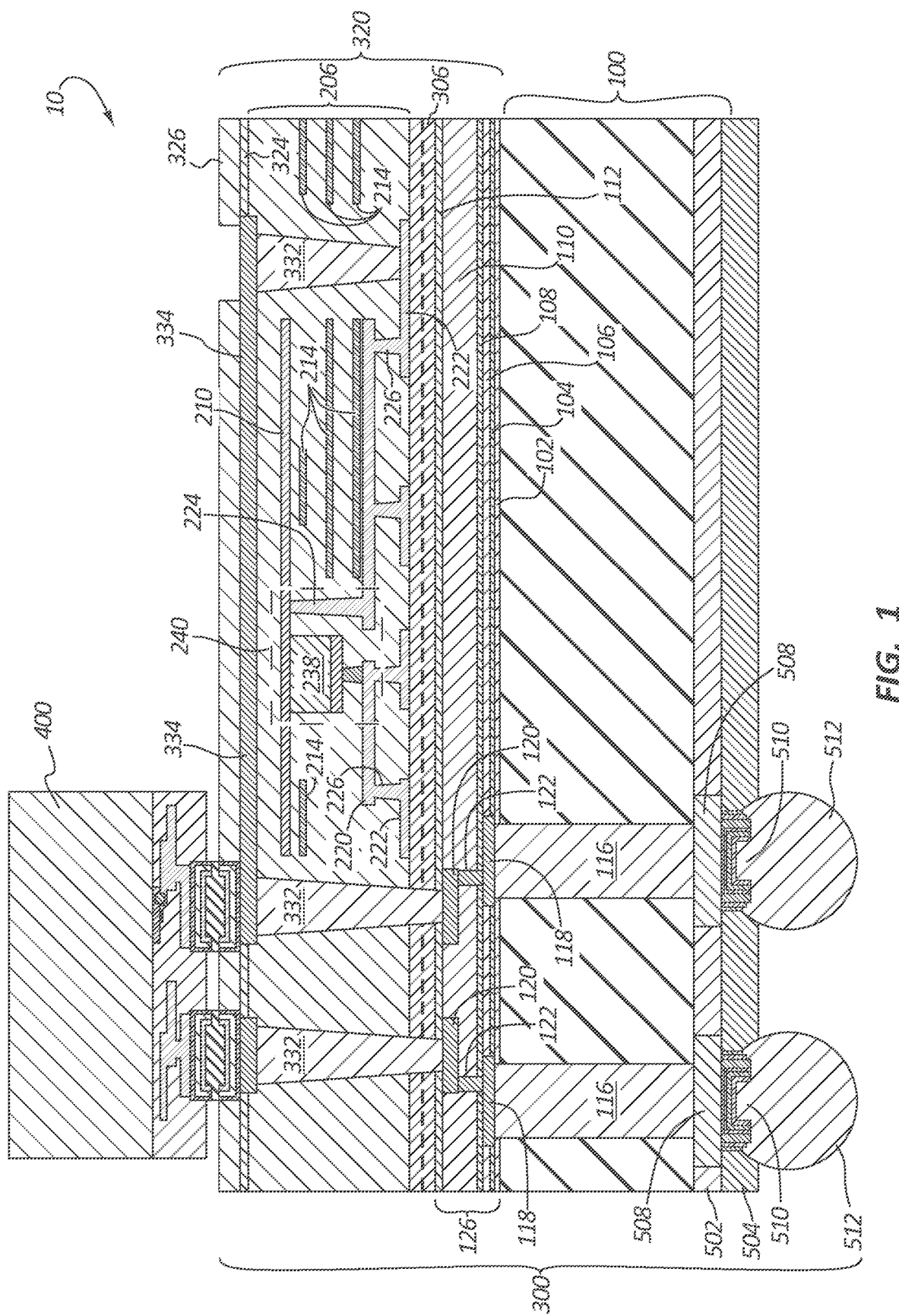
FIG. 1 is a cutaway side view of an optoelectronic system having an interposer that includes an interposer dielectric stack in which there is fabricated and defined one or more photonics device.

In FIG. 1, there is shown an optoelectrical system 10 having an active photonics interposer 300 that can include one or more active photonics device that can convert a photonics signal to an electrical signal. Photonics interposer 300 can include an interposer base defined by substrate 100.

Interposer 300 can include an interposer base having substrate 100 and interposer base dielectric stack 126. There can be fabricated within interposer base dielectric stack 126 one or more metallization layer e.g. metallization layer 118 metallization layer 122 as well as vertically extending vias 122. The interposer base can support through vias 116 which can extend through a thickness of substrate 100. In one embodiment, through vias 116 can extend through a thickness of substrate 100 by extending entirely (completely) through a thickness of substrate 100. In one embodiment, through vias 116 can extend through a thickness of substrate 100 by extending partially through a thickness of substrate 100. Substrate 100 can be formed of e.g. silicon, Si, sapphire, or glass. On substrate 100 there can be fabricated a backside redistribution layer 508 for fanning out electrical signals to and from through vias 116.

Interposer 300 can also include photonics device dielectric stack 206 in which there can be fabricated and defined one or more photonics device e.g. one or more waveguide 210, one or more waveguide 214, and one or more photodetector 240. Photonics device dielectric stack 206 can support one or more through vias 332 which can extend through a thickness of photonics device dielectric stack 206. In one embodiment, through vias 332 can extend through photonics device dielectric stack 206 by extending entirely (completely) through photonics device dielectric stack 206. In one embodiment, through vias 332 can extend through photonics device dielectric stack 206 by extending through bottom and top elevations of one or more photonics device. In one embodiment, through vias 332 can extend through photonics device dielectric stack 202 by extending through bottom and top elevations of a plurality of photonics devices. In one embodiment, through vias 332 can extend through photonics device dielectric stack 206 by extending partially through photonics device dielectric stack 206. There can be fabricated within photonics device dielectric stack 206 one or more metallization layer e.g. metallization layer 220 metallization layer 222 as well as vertically extending vias 226. Metallization layers as set forth herein define horizontally extending wires to carry one or more of control, logic and/or power signals.

In one aspect vias of through vias 332 extending through photonics device dielectric stack 206 can be associated to respective through vias 116 extending through a thickness of substrate 100. Advantageously through vias 332 can be sized significantly smaller than through vias 116 thus freeing up real estate in photonics device dielectric stack 206, permitting fabrication of additional and/or larger photonics devices in photonics device dielectric stack 206. A through via 116 can be connected to an associated through via 332 by way of a bridge connection. Interposer 300 can include a bond layer 306 that bonds interposer base dielectric stack 126 to photonics device dielectric stack 206. Supported on substrate 100, interposer 300 can include an interposer dielectric stack 320 that includes interposer base dielectric stack 126, bond layer 306, and photonics device dielectric stack 206.

Interposer 300 as shown in FIG. 1 can feature backside to frontside electrical connectivity e.g. as provided by through vias of a plurality of through vias 116 extending through base interposer substrate 100 and being associated to respective through vias of a plurality of through vias 332 extending through photonics device dielectric stack 206. Interposer 300 as shown in FIG. 1 can feature backside and frontside wiring, e.g. for horizontal distribution of one or more of control, logic and/or power signals. A backside of interposer 300 can include one or more redistribution layer e.g. redistribution layer 508 defining backside wiring. A frontside of interposer 300 can include one or more metallization layer e.g. metallization layer 334 defining frontside wiring.

Optoelectrical system 10 can include under bump metallization formations 510 provided in the embodiment shown by pads that are in electrical communication with vertically extending through vias 116 that extend through substrate 100. Solder bumps 512 of interposer 300 can be formed on under bump metallization pads 510.

Figure 2:
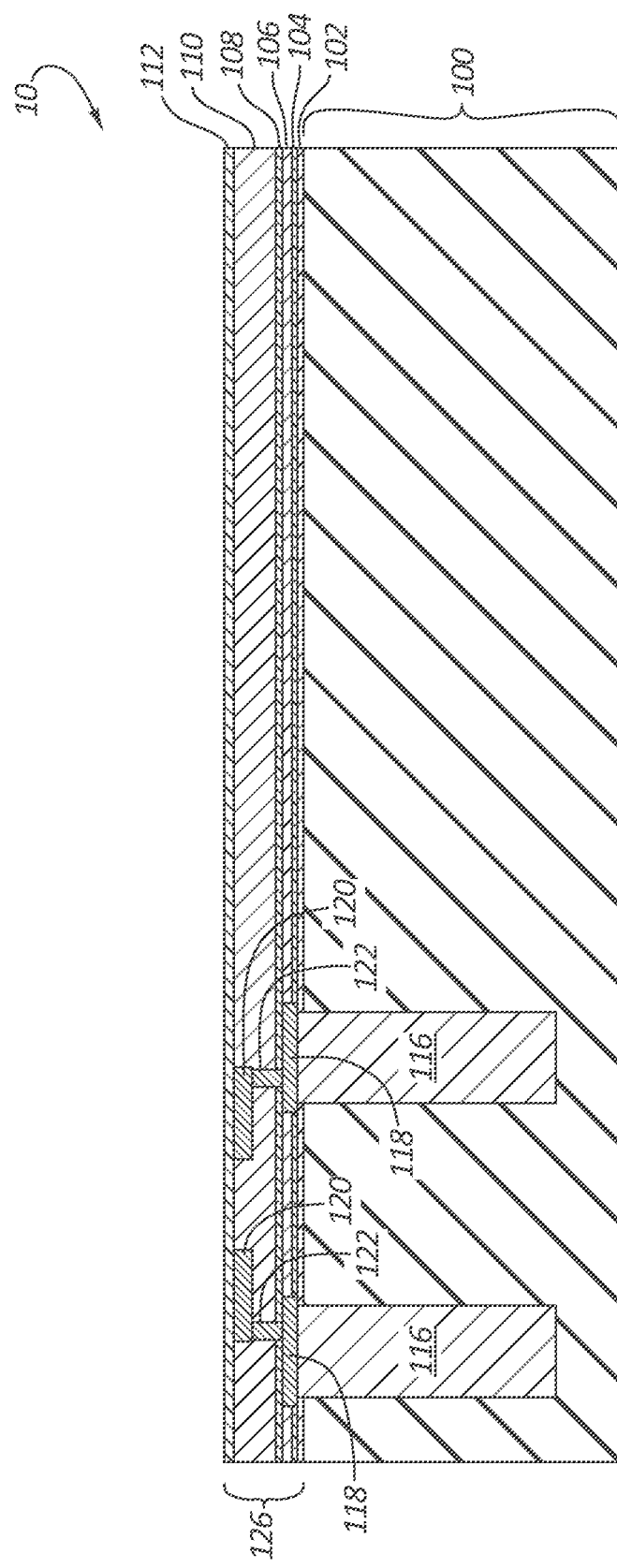
FIG. 2 illustrates an optoelectronic system in an intermediary stage of fabrication after build of an interposer base on a bulk wafer having a wafer substrate.

FIG. 2 illustrates fabrication of an interposer base structure which can include substrate 100 and interposer base dielectric stack 126. Substrate 100 can support through vias 116 which can be referred to as through silicon vias (TSVs) in the case that substrate 100 is a silicon substrate. Substrate 100 can be provided by a bulk silicon wafer in one embodiment. For formation of through vertically extending through vias 116, substrate 100 can be subject to etching e.g. reactive ion etching (RIE) and the resulting trenches can be filled with conductive material. The structure of FIG. 2 can be patterned to include multiple dielectric layers such as dielectric layers 102, 104, 106, 108, 110, and 112 supported by substrate 100 and defining interposer base dielectric stack 126. Within interposer base dielectric stack 126 there can be patterned multiple metallization layers, such as metallization layer 118 and metallization layer 120. Vertically extending through vias 116 can be fabricated within interposer base dielectric stack 126 to provide electrical connectivity between metallization layers on front and backside of a fabricated photonics interposer 300 as set forth in FIG. 1. In some embodiments, the materials of the different dielectric layers 102, 104, 106, 108, 110, and 112 can be differentiated. For example, dielectric layer 102 can be used as a hardmask for patterning of through vias 116 and can be selected for optimization of its functioning as a hardmask. Dielectric layers such as dielectric layers 104, 108, and 112 can be deposited over respective metallization layers or other conductive material formations and can be selected to inhibit conductive material migration. Remaining dielectric layers such as layers 104 and 106 can be formed of dielectric material other than dielectric material defining remaining dielectric layers of interposer base dielectric stack 126. In one embodiment dielectric layers 104 and 106 can be formed of tetraethyl orthosilicate (TEOS) or other appropriate SiOx derivatives.

Figure 3:
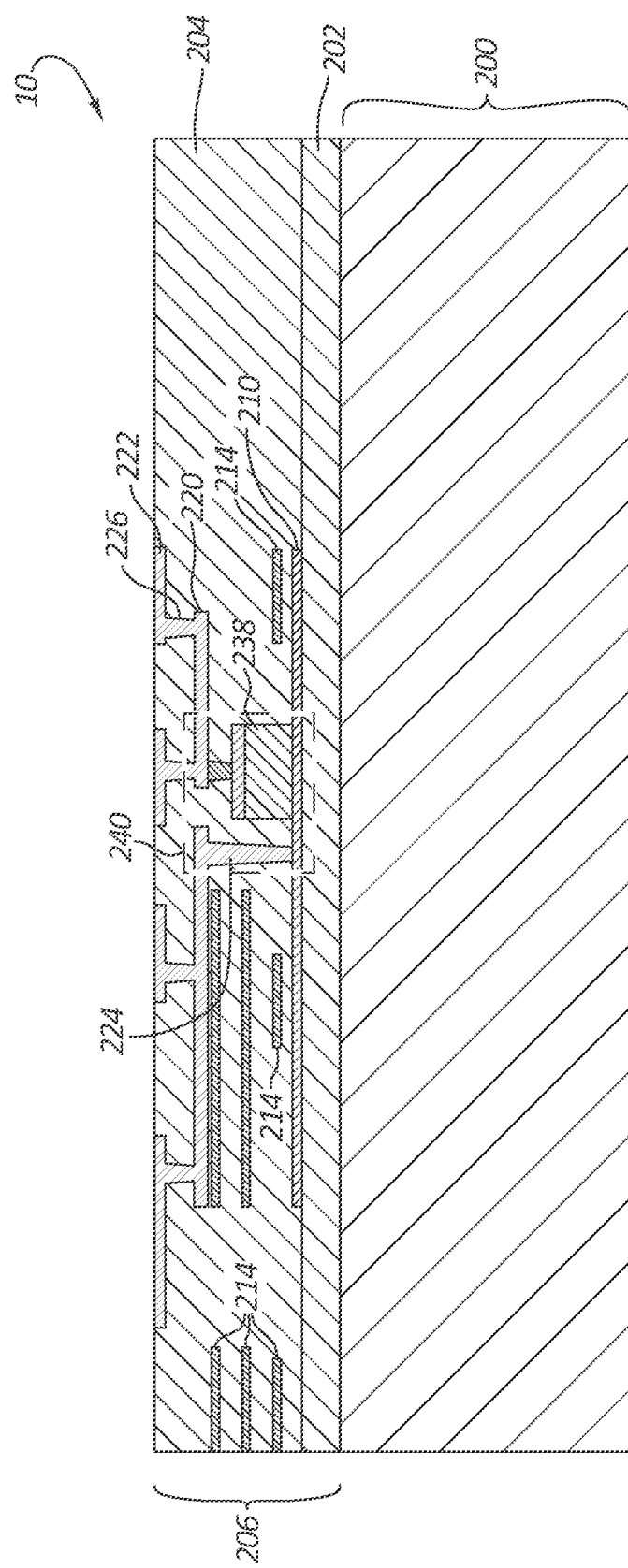
FIG. 3 is a cross sectional side view illustrating an optoelectrical system in a partial stage of fabrication after build of a photonics structure having a photonics structure dielectric stack in which there is integrally fabricated and defined one or more photonics device, and wherein the build is performed using a silicon over on insulator (SOI) wafer.

FIG. 3 illustrates fabrication of photonics structure having a photonics dielectric stack 206 in which there can be fabricated and defined one or more photonics device such as one or more waveguide of waveguides 210, one or more waveguide of waveguides 214, or one or more photodetector 240. The photonics structure as shown in FIG. 3 can be fabricated using a silicon on insulator (SOI) wafer. Such SOI wafer can be prefabricated to include an insulator formed on a substrate and a thin silicon layer formed on the insulator. FIG. 3 illustrates remaining elements of a SOI wafer after patterning. Namely, substrate 200 can be the substrate of a SOI wafer, dielectric layer 202 can be the insulator layer of a SOI wafer, and waveguide 210 as shown in FIG. 3 can be defined by a remaining portion of a silicon layer of a SOI wafer after patterning of such layer to define waveguide 210.

Referring to FIG. 3, one or more dielectric layer 204 can be formed on dielectric layer 204 which in one embodiment can be provided by the insulator layer of a SOI wafer to define photonics device dielectric stack 206. In dielectric stack 206, there can be patterned waveguides formed of different materials. For example, waveguides 210 can be formed of silicon whereas waveguides 214 can be formed of different material such as silicon nitride SiN. Some applications may favor use of silicon waveguides, whereas other applications may favor use of silicon nitride waveguides. The providing of waveguides of different materials can enhance performance and flexibility of the structure shown in FIG. 3. In dielectric stack 206, there can be patterned waveguides formed at different elevations. For example, waveguides 210 which can be formed of silicon can be formed at a first elevation and waveguides 214 which can be formed of nitride can be formed respectively at second, third, and fourth elevations as shown.

Referring to additional features shown in the intermediary fabrication stage view of FIG. 3 optoelectrical system 10 can include one or more photonics device formed integral with photonics device dielectric stack 206. In some embodiments, material, e.g. monocrystalline silicon, polycrystalline silicon, germanium forming photonics devices such as photodetector 240 can be epitaxially grown. Embodiments herein recognize that while a thick layer of silicon may accommodate epitaxially growing a resulting photonics device may exhibit light losses through the thick silicon layer. In one embodiment, for accommodating epitaxially growth of epitaxially growth material, a structure having seed layer of silicon (a silicon template) on an insulator can be provided. The seed layer can be a crystalline seed layer. For providing a structure having a seed layer of silicon, a silicon on insulator (SOI) wafer (having a thin layer of oxide on a bulk silicon substrate and a thin layer of silicon on the oxide) can be selected. In one embodiment where an SOI wafer is used for fabrication of interposer 300, substrate 200 can be provided by a bulk silicon substrate of a SOI wafer.

As shown in the FIG. 3 one or more photonics device fabricated within photonics device dielectric stack 206 can include waveguides 214 defined by waveguiding material layer. In one embodiment, waveguides 214 can be fabricated by depositing material forming a waveguiding material layer, masking and etching to remove unwanted areas of waveguiding material layer and depositing a dielectric layer over the remaining portion of the waveguiding material layer. Waveguiding material layers defining waveguides 214 can include e.g. monocrystalline silicon, polycrystalline silicon, amorphous silicon, silicon nitride, or silicon oxynitride. In one embodiment photonics device dielectric stack 206 can be fabricated to include a silicon on insulator interface at an elevation above and spaced apart from substrate 200. For example, a thick layer of silicon above a top elevation of substrate 200, e.g. epitaxially grown on a substrate 200 where formed of silicon, can be subject to separation by local or non-local implanted oxygen (SIMOX) processing to define a thin silicon layer and buried oxide layer below the thin silicon layer.

Waveguides fabricated of different materials within photonics device dielectric stack 206 as shown in FIG. 3 can be used for performance of different functions. For example, waveguides formed of silicon might be selected for fabrication of waveguides included in active devices such as photodetectors or modulators. Dielectric waveguides (e.g. formed of silicon nitride) can be adapted for transmission of optical signals to longer distances. Other materials such as amorphous silicon might be selected for applications where a balance of current conduction properties and light conduction properties is emphasized. Patterning of a waveguide can include patterning of material defining the waveguide as well as patterning of material surrounding the waveguide having an index of refraction differentiated from an index of refraction of a material of the waveguide. Patterning of a waveguides 210 and waveguides 214 can include patterning to define different alternative geometries.

With appropriate fabrication methodologies photonics devices provided by or having waveguides of different waveguiding material can be fabricated at any elevation of photonics device dielectric stack 206. In one embodiment, epitaxially grown photonics devices can be fabricated at on substrate locations of photonics device dielectric stack 206, and photonics devices formed of deposited materials, e.g. formed of deposited silicon nitride or silicon oxynitride can be formed at an above substrate elevation of photonics device dielectric stack 206. Photonics device dielectric stack 206 can be fabricated to conduct light between elevations by evanescent coupling between waveguides at different elevations.

Various processes can be performed for modifying a grain structure of a material layer from which various photonics devices can be fabricated. In one embodiment, a material layer can be formed of polycrystalline silicon (polysilicon). In one embodiment, ion implantation can be performed to modify the silicon crystal structure of a material layer. On modification, polysilicon material can be transformed into amorphous polysilicon material. Ion implant species can include one or more of silicon, argon (e.g., Ar or Ar+), xenon (e.g., Xe or Xe+) or germanium. In another aspect, an annealing process, e.g., a recrystallization annealing process can be performed to further improve a grain structure of a material layer. In one embodiment, with or without ion implantation, a material layer can be subject to annealing for modification of a grain structure.

For enhancing performance of photonics devices integrally formed in photonics device dielectric stack 206, photonics device dielectric stack 206 can include features for reducing coupling between integrally fabricated photonics devices and substrate 200. In one embodiment substrate 200 can include deep trench isolation features in regions of the structure shown in FIG. 3 in which photonics devices are integrally formed.

Patterned within photonics dielectric stack 206 there can also be metallization layer 220 and metallization layer 222. There can also be patterned vertically extending vias 224 providing electrical communication between metallization layer 220 and waveguide 210. There can also be patterned vertically extending vias 226 providing electrical communication between metallization layer 220 and metallization layer 222. Regarding photodetector 240, photodetector 240 can include formation 230 which can be defined by photon sensitive material disposed in a trench e.g. a germanium filled trench. Photon sensitive material can convert photons into electrons, and accordingly can convert a photon based signal into an electrical based signal. Referring to photodetector 240, the conductive path defined by via 224, can be used for voltage input into waveguide 210. The conductive path having metallization layer 220 above the elevation of formation 238 can be used for electrical signal detection, wherein an electrical signal can be output based on photonics signal transmittal through waveguide 210 for detection by photodetector 240.

As set forth herein, photonics device dielectric stack 206 can be patterned to define one or more photonics device so that one or more photonics device is fabricated within dielectric stack 20. One or more layer of photonics dielectric stack 206 can be patterned to define one or more waveguide, e.g., according to waveguides 210 and/or waveguides 214, so that one or more waveguide is integrally fabricated within dielectric stack 206. One or more layer of photonics device dielectric stack 206 can be patterned to define one or more photodetector, e.g. according to photodetector 240, so that one or more photodetector is integrally fabricated within dielectric stack 206. One or more layer of photonics device dielectric stack 206 can be patterned to define one or more grating coupler so that one or more grating coupler is integrally fabricated within dielectric stack 206. One or more layer of photonics device dielectric stack 206 can be patterned to define one or more grating coupler so that one or more grating coupler is integrally fabricated within dielectric stack 206. One or more layer of photonics device dielectric stack 206 can be patterned to define one or more modulator so that one or more modulator is integrally fabricated within dielectric stack 206. One or more layer of photonics device dielectric stack 206 can be patterned to define one or more polarizer so that one or more polarizer is integrally fabricated within dielectric stack 206. One or more layer of photonics device dielectric stack 206 can be patterned to define one or more splitter so that one or more splitter is integrally fabricated within dielectric stack 206. One or more layer of photonics device dielectric stack 206 can be patterned to define one or more resonator so that one or more resonator is integrally fabricated within dielectric stack 206.

Metallization layer 220 and metallization layer 222 can define horizontally extending wires. Wires defined by metallization layers 220 and 222 can be horizontally extending through areas of photonics device dielectric stack 206. Metallization layers 220 and 222 can be formed generally by depositing one or more interposer material layer to at least top elevation of the respective metallization layer 220 and 222, etching to define trenches for receiving conductive material, filling the cavities with conductive material, and then planarizing to the top elevation of the respective metallization layer 220 and 222. Metallization layers 220 and 222 can also be formed generally by depositing uniform thickness metallization layers, and then masking and etching to remove layer material from unwanted areas. Metallization layers 220 and 222 can be formed from metal or other conductive material. Horizontally extending wires defined by metallization layer 222 can be electrically connected to one or more vertically extending vias 226 for distribution of one or more of control, logic and/or power signals vertically and horizontally to different areas of photonics device dielectric stack 206 having fabricated therein one or more photonics device. Horizontally extending wires defined by metallization layer 220 can be electrically connected to one or more of vertically extending vias 226 and/or vertically extending via 224 for distribution of one or more of electrical control, logic and/or power signals vertically and horizontally between different areas of photonics device dielectric stack 206. Wires defined by metallization layer 222 can be electrically connected to one or more of vertically extending vias 226 for distribution of one or more of electrical control, logic and/or power signals vertically and horizontally between different areas of photonics device dielectric stack 206.

Figure 4:
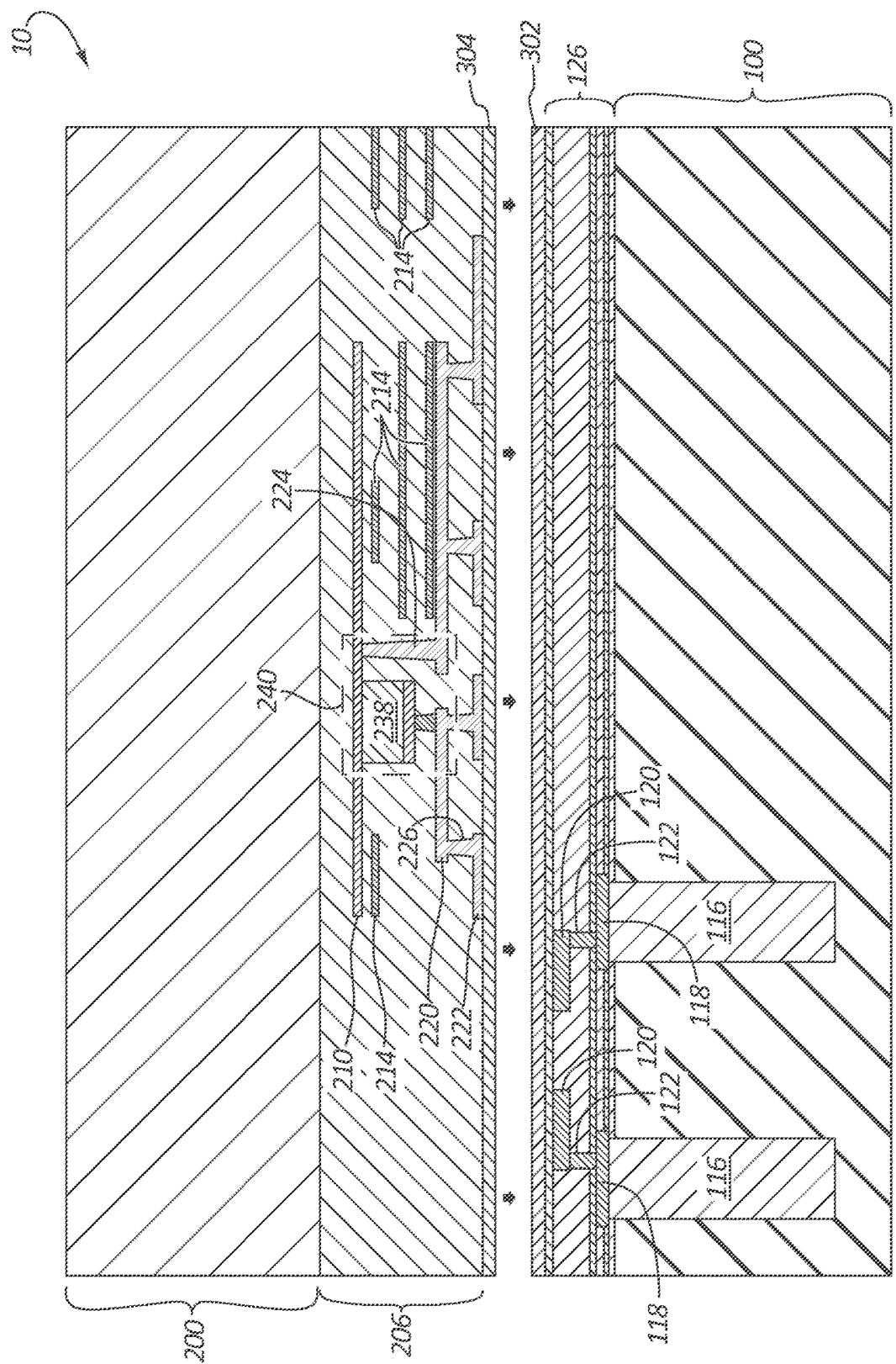
FIG. 4 is a cross sectional side view illustrating fabrication of an optoelectrical system showing interposer base structure of FIG. 2 being aligned with the photonics structure of FIG. 3.

In FIG. 4 there is shown the photonics structure built as described in reference to FIG. 3, aligned to the interposer base structure built as described in reference to FIG. 2. Referring to FIG. 4, an oxide bonding thermal process is described. Low temperature oxide fusion bonding can be utilized. Low temperature oxide fusion bonding can be performed at lower temperatures e.g. 300° C. or lower. For performance of low temperature oxide fusion bonding, dielectric layers formed of silicon dioxide can be deposited as shown in FIG. 4. Dielectric layer 302 formed of silicon dioxide can be deposited on interposer base dielectric stack 126 and dielectric layer 304 formed of silicon dioxide can be deposited on photonics device dielectric stack 206. Prior to depositing of layers 302 and 304, their respective under surfaces can be polished, e.g. using chemical mechanical planarization (CMP) to define smooth surfaces to facilitate quality contact for promotion activation of van der waals forces The surfaces of layers 302 and 304 after their deposition and smoothing, can be treated to define appropriate surface chemistry to promote bonding between the two layers on an atomic level.

Figure 5:
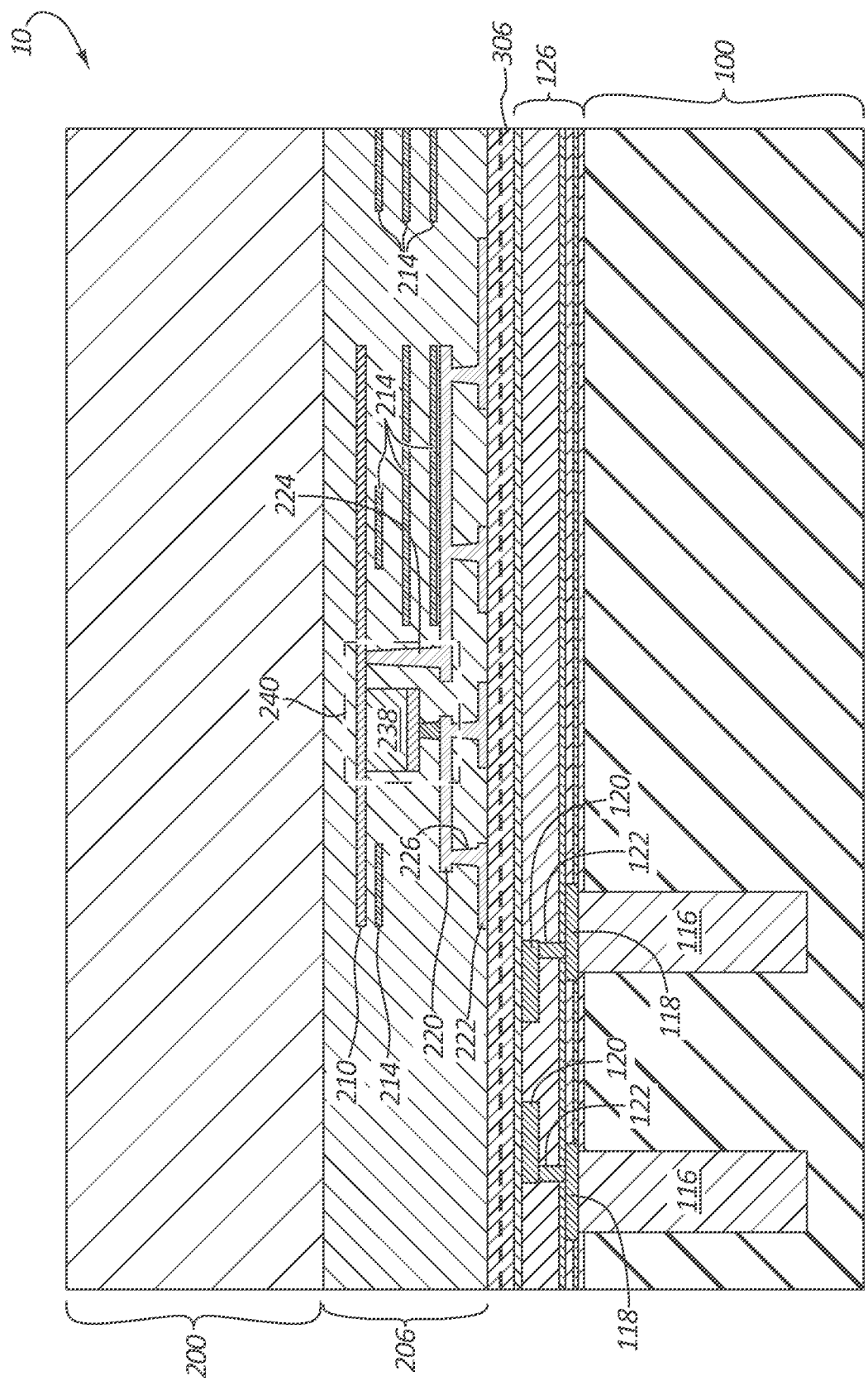
FIG. 5 is a cross sectional side view illustrating the photonics structure shown in FIG. 3 being bonded to the interposer base structure of FIG. 2.

Referring to FIG. 5, FIG. 5 illustrates bonding between the photonics interposer base structure as shown in FIG. 2 and the photonics structure as shown in FIG. 3. On bonding of the structures using low temperature oxide fusion bonding as set forth in FIG. 4 the respective structures can be integrally formed together and can define a bond layer 306 between interposer base dielectric stack 126 and photonics device dielectric stack 206. Bonding of the base interposer structure of FIG. 2 and the photonics structure of FIG. 3 and use of dielectric layers 302 and 304 can be completed by an annealing process for annealing of the layers 302 and 304 to form bond layer 306 which in one embodiment can be regarded as a bond dielectric layer and in one embodiment can be provided by a low temperature oxide fusion bond dielectric layer. In one embodiment, substrate 100 can be provided by a substrate of a bulk silicon wafer and substrate 200 can be provided by a substrate of a SOI wafer and in one embodiment each wafer can be provided by a 300 millimeter wafer, a wafer bonder such as a 300 millimeter wafer bonder can be used for completion of bonding of a base interposer structure to a photonics structure as illustrated in FIG. 5.

Bonding as described in reference to FIG. 5 can be performed with the thicknesses of base interposer substrate 100 (which can be provided by a bulk wafer) and substrate 200 (which can be provided by a SOI wafer substrate) preserved to their full thickness e.g. having a thickness of about 775 microns. Thus, the bonding set forth in reference to FIG. 5 can be performed with low risk of wafer breakage and can be carried out without use of handle wafers.

Figure 6:
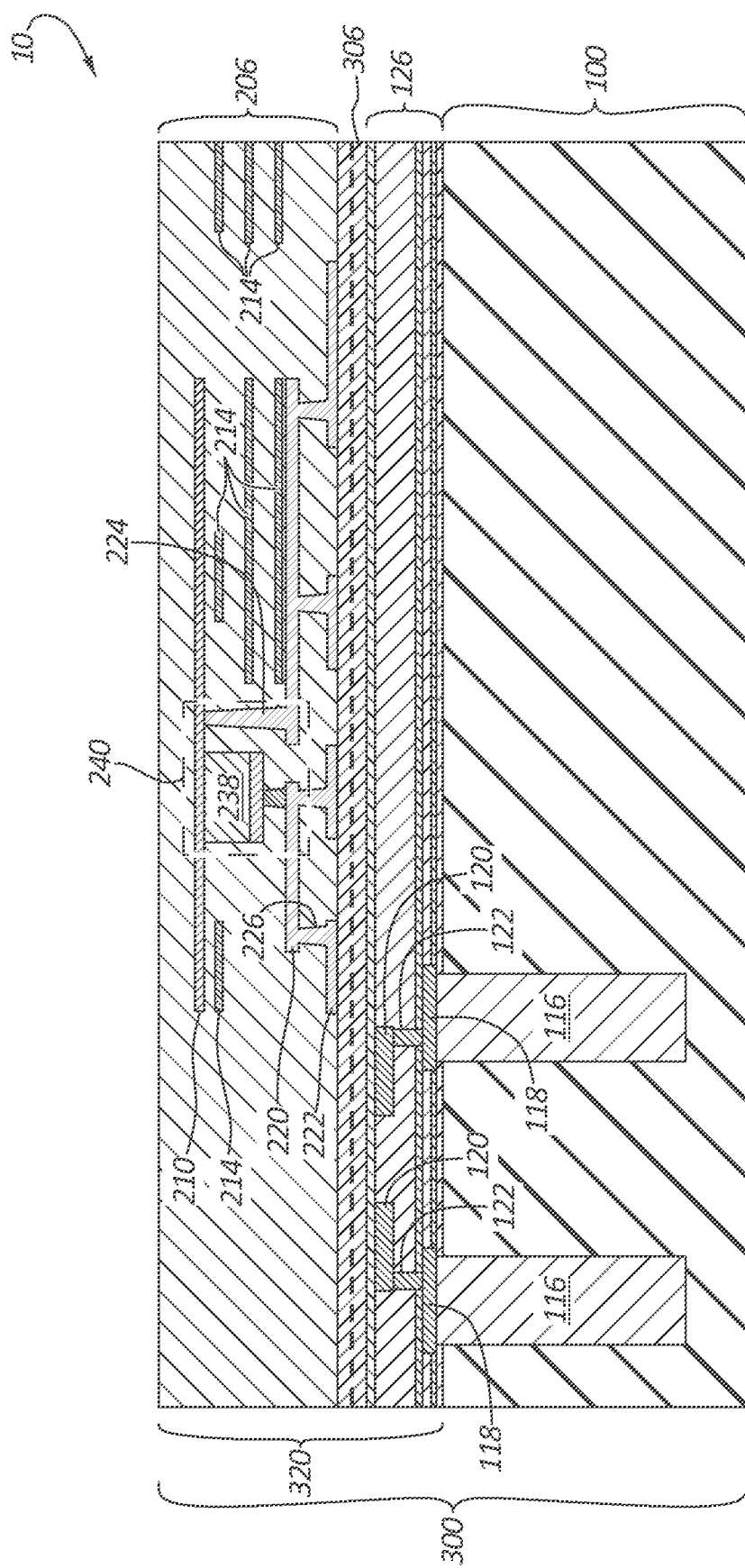
FIG. 6 is a cross sectional side view of an optoelectrical system in a partial stage of fabrication as shown in FIG. 5 after removal of a substrate from a photonics structure.

FIG. 6 illustrates the optoelectrical system as shown in FIG. 5 after removal of substrate 200 to define in interposer 300 having substrate 100 and interposer dielectric stack 320, which interposer dielectric stack 320 can include interposer base dielectric stack 126, bond layer 306, and photonics device dielectric stack 206. For removal of substrate 200, various processes can be used. For example, a majority of an original thickness of substrate 200 can be eliminated with use of a grinding process which can stop at a predetermined distance e.g. about 10 microns from top elevation of photonics device dielectric stack 206. With a relatively thin e.g. 10 micron thickness portion of substrate 200 remaining, where substrate 200 is formed of silicon. The remaining portion of substrate 200 can be removed e.g. via reactive ion etching (RIE). The reactive ion etching (RIE) can be selective of silicon (where substrate 200 is formed of silicon) so that silicon material of substrate 200 can be removed without removal of dielectric material of photonics device dielectric stack 206.

Figure 7:
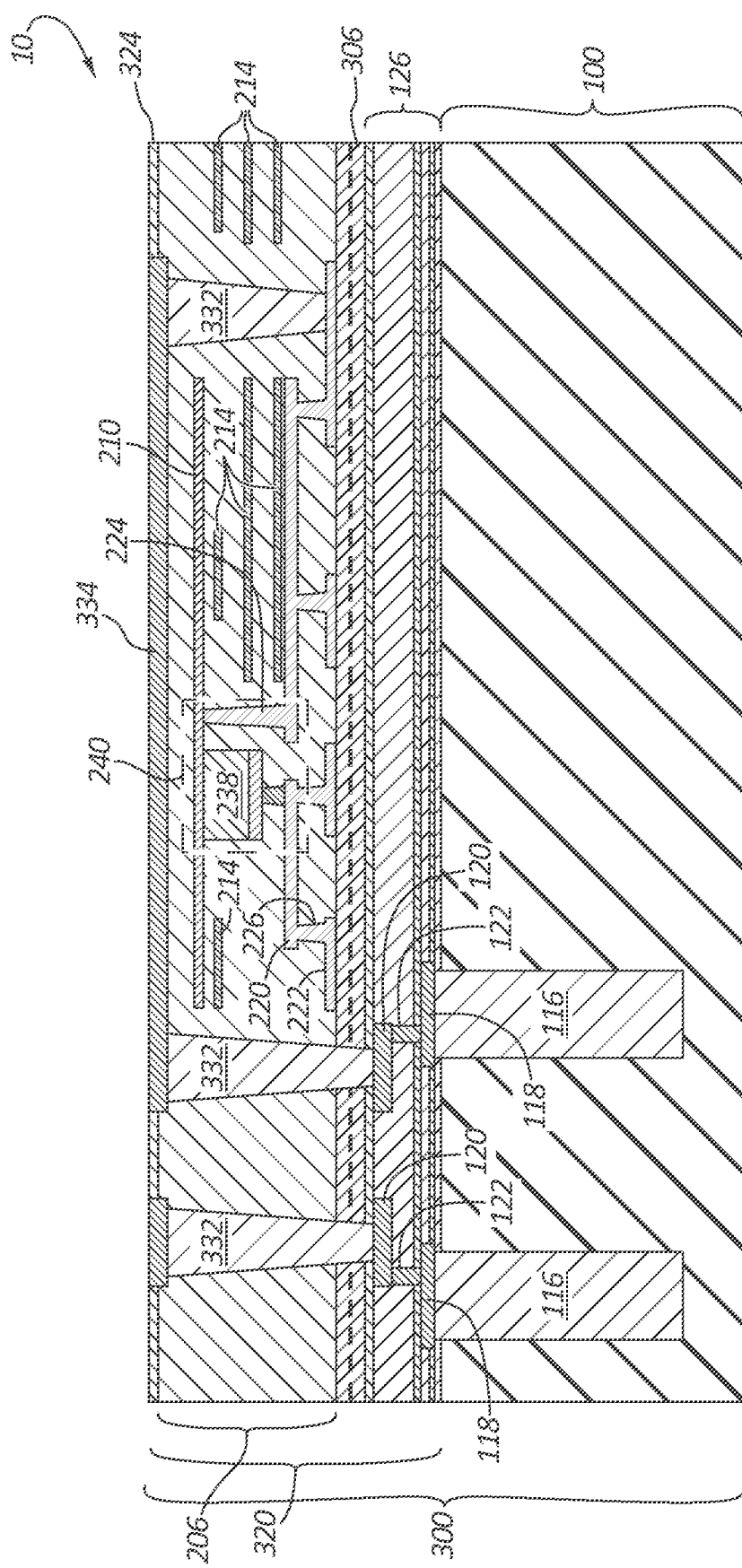
FIG. 7 is a cross sectional side view of an optoelectrical system as shown in FIG. 6 in an intermediary stage of fabrication after further patterning to define inter and intra layer vias and metallization layer(s) for connectivity between bonded device layers and to provide electrical connectivity to a backside of a fabricated interposer having an interposer substrate.

FIG. 7 illustrates the optoelectrical system of FIG. 6 after patterning to form vertically extending through vias 332 and metallization layer 334. For fabrication of vertically extending vias 332 and metallization layer 334 dielectric layer 324 can be formed using a damascene fabrication process on photonics device dielectric stack 206. Trench features can be formed in dielectric layer 324 and photonics device dielectric stack 206 using e.g. reactive ion etching (RIE) that is selective to certain dielectric, polymer masking films, or underlying metal materials so that material is removed by the reactive ion etching (RIE) to form a dimensionally desired feature. The formed trenches can then be filled with conductive material e.g. copper for formation of vertically extending through vias 332 and metallization layer 334. Vertically extending through vias 116 which can extend entirely through or substantially entirely through substrate 100 can be regarded as through vias and can be regarded as through silicon vias (TSVs) where substrate 100 is formed of silicon. Vertically extending through vias 332 which can extend entirely through or substantially entirely through photonics device dielectric stack 206 can be regarded as through vias and can be regarded as through oxide vias (TOVs) where photonics device dielectric stack 206 includes one or more oxide based dielectric layer. Vias 122, vias 224 and vias 226 which can be smaller diametered than through vias 116 or through vias 332 can be regarded as contact vias or in the case that they commence and terminate at elevations within elevations of dielectric stack 126 or 206, intra stack vias.

Regarding left side through vias 332 as shown in FIG. 3 left side through vias 332 can extend through bond layer 306 and can be electrically connected to metallization layer 140 fabricated in interposer base dielectric stack 126. Regarding left side through vias 332 as shown in FIG. 3 left side through vias 332 can extend from metallization layer 140 fabricated in interposer base dielectric stack 126 through bond layer 306 through a plurality of layers of photonic device dielectric stack 206 and can terminate at metallization layer 334 fabricated at a top layer of photonic device dielectric stack 206. Left side through vias 332 can extend through multiple layers of photonic device dielectric stack 206. Left side through vias 332 can extend through multiple layers of photonic device dielectric stack 206 and thereby can extend through top and bottom elevations of a plurality of photonics devices fabricated at various elevations of the photonic device dielectric stack 206 e.g. through the top and bottom elevations of waveguides 212, photodetector 240 and waveguide 210. Regarding right side through vias 332 as shown in FIG. 3 right side through vias 332 can extend from metallization layer 222 fabricated in photonics device dielectric stack 206 through a plurality of layers of photonic device dielectric stack 206 and can terminate at metallization layer 334 fabricated at a top layer of photonic device dielectric stack 206. Metallization layer 334 which can define a strap (hook) connection in the embodiment as shown in FIG. 7 can provide a conductive path from a backside of interposer 300 e.g. the area below the backside being defined below substrate 100 as shown in FIG. 7 to any device defined within photonics device dielectric stack 206.

As shown in the intermediary fabrication stage view of FIG. 7, a conductive path providing a strap (hook) connection can be defined so that an input voltage from a backside of interposer 300 can be input into photodetector 240 by way of the conductive path defined by redistribution layer 508 (backside) connected to through via 116 extending through substrate 100 connected to an associated vertically extending through via 332 extending through photonic device dielectric stack 206 connected metallization layer 334 (frontside) connected to vertically extending through via 332 connected to metallization layer 222 connected to via 226 connected to metallization layer 220 which can provide an input voltage to photodetector 240. A bridge connection that connects vertically extending through via 116 and vertically extending through via 332 can be provided by metallization layer 118 connected to vertically extending through via 116 which connects to via 122 which connects to metallization layer 120 which connects to via vertically extending through via 332. Optoelectrical system 100 can include multiple ones of such bridge connections, e.g. in one embodiment individual through vias 116 of a plurality of vertically extending through via 116 can include respective bridge connections, each respective bridge connection connecting a vertically extending through viae 116 to a respective vertically extending through via 332 extending through photonics device dielectric stack 206. Metallization layer 118, vertically extending via 122, and metallization layer 120 can be fabricated and defined integrally with interposer base dielectric stack 126. Where through vias 332 extend through the bottom and top elevations of one or more photonics device e.g. a waveguide 214 a waveguide 210 or a photodetector 240 as shown in FIG. 7 through vias 332 can be regarded as photonics structure through vias.

Referring to photonics device dielectric stack 206, dielectric layers defining stack 206 can include differentiated materials. For example, layer 202 can be provided by the thermal oxide layer of a starting SOI wafer as set forth herein. Dielectric layers of photonics device dielectric stack 206 can be selected for optimization of waveguide performance e.g. in one embodiment, cladding layers around waveguides can be provided by silane oxide. Dielectric layers of photonics device dielectric stack 206 that are deposited on metallization layers can be selected to resist migration of conductive material. Remaining layers of photonics device dielectric stack 206 can be formed of such material such as e.g. tetraethyl orthosilicate (TEOS) or other appropriate SiOx derivatives.

Figure 8:
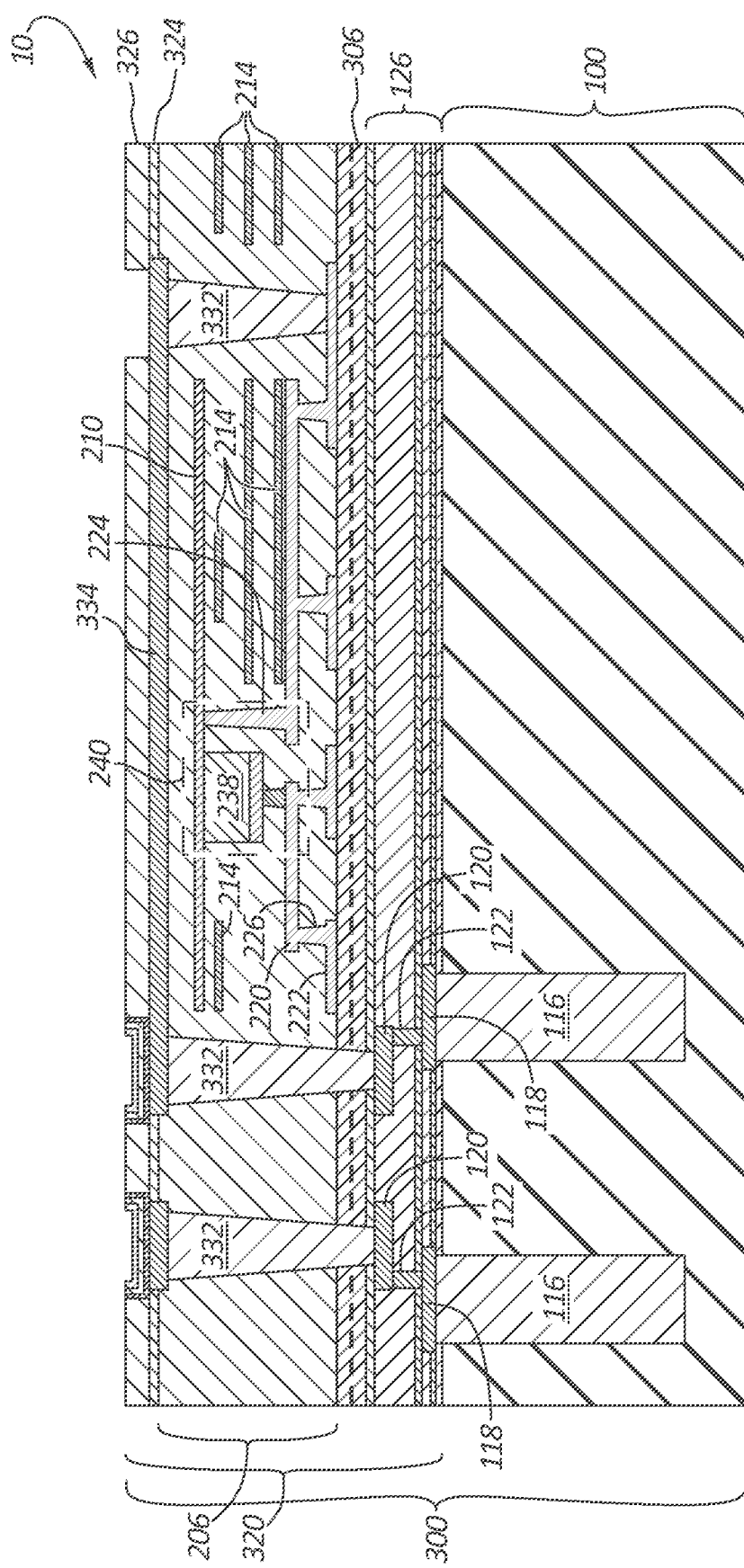
FIG. 8 is a cross sectional side view of the optoelectrical system as shown in FIG. 7 in an intermediary stage of fabrication after further patterning to define under bump metallization formations.

FIG. 8 illustrates the optoelectrical system 10 of FIG. 7 after patterning to define under bump metallization formations 336. Under bump metallization formations 336 provided by pads in the embodiment shown can be fabricated by way of a process including depositing of dielectric layer 326, and further patterning to define under bump metallization formations 336. In a stage depicted in FIG. 8 interposer dielectric stack 320 encompasses dielectric layer 326, which in one embodiment can be formed of TEOS.

Figure 9:
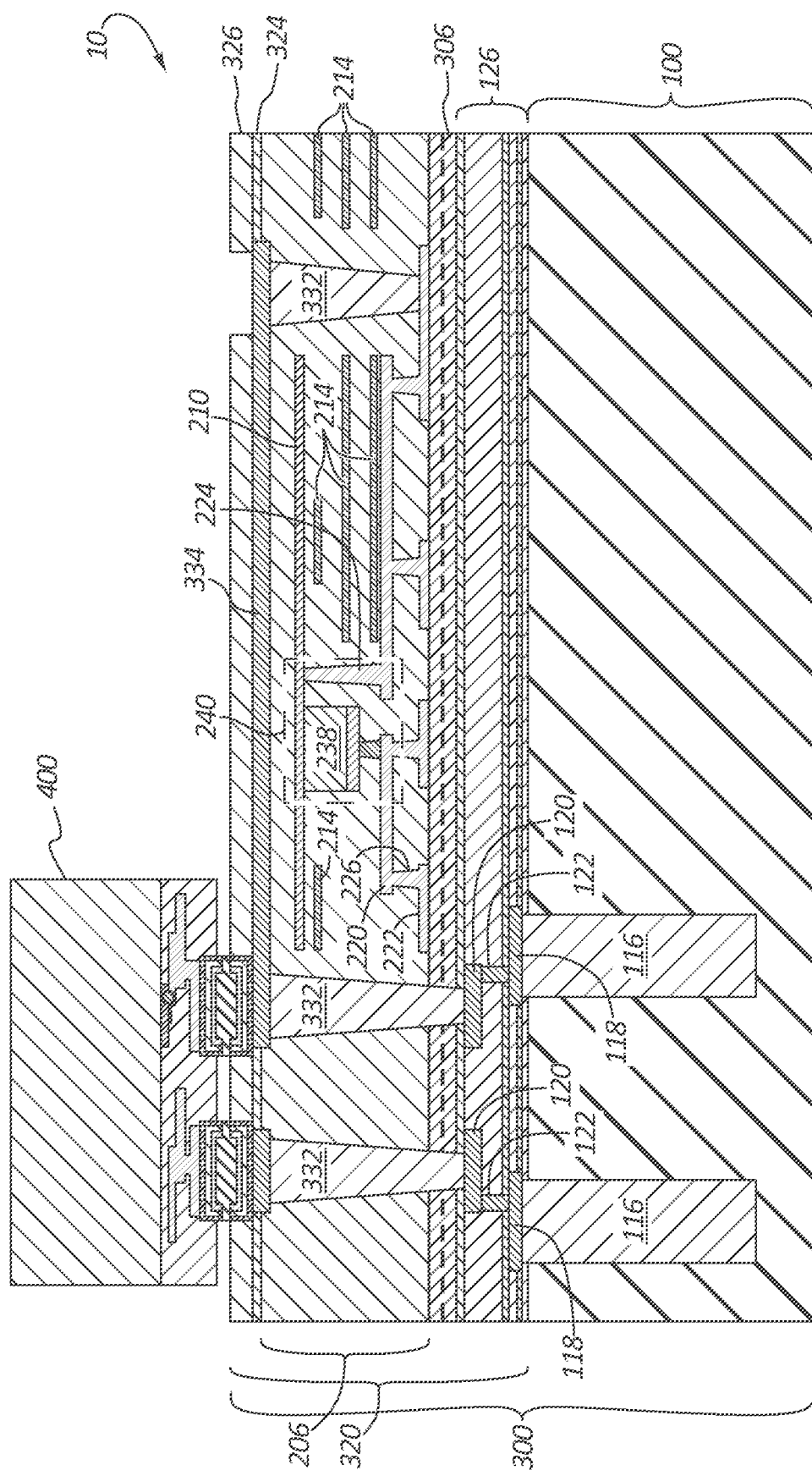
FIG. 9 illustrates a cross sectional side view of the optoelectrical system as shown in FIG. 8 in an intermediary stage of fabrication after metal solder attachment of an integrated circuit chip to the under bump metallization formations fabricated as shown in FIG. 8.

FIG. 9 illustrates optoelectrical system 10 after attachment of integrated circuit chip 400, which in one embodiment can be provided by a CMOS logic chip. CMOS logic chip 400 can include under bump metallization formations corresponding to metallization formations 336 as set forth in reference to FIG. 8. Integrated circuit chip 400 can be attached to under bump metallization formations 336 by way of flip chip bonding of integrated circuit chip 400 to under bump metallization formations 336 which formations 336 can be fabricated using dielectric layer 326. Attachment of integrated circuit chip 400 can be supplemented by applying an epoxy underfill (not shown) at an interface between integrated circuit chip 400 and dielectric layer 326.

Figure 10:
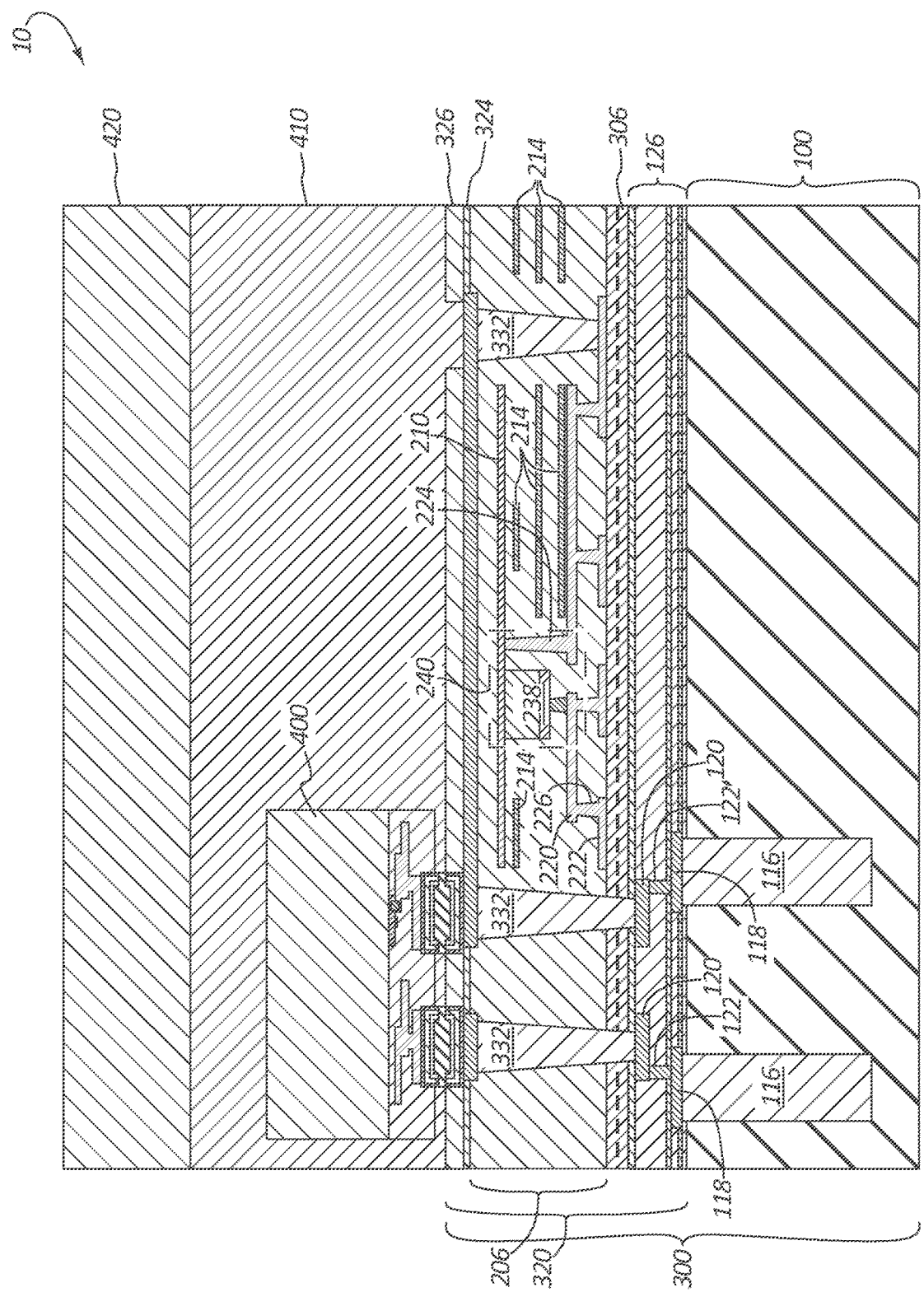
FIG. 10 is a cross sectional side view illustrating the optoelectrical system as shown in FIG. 9 in an intermediary stage of fabrication after attachment of a handle wafer to the structure as shown in FIG. 9 using an adhesive, epoxy, or other permanent organic polymer.

FIG. 10 illustrates the optoelectrical system 10 as shown in FIG. 9 after attachment of a handle wafer 420. Handle wafer 420 can be attached to the structure shown in FIG. 9 using an adhesive layer 410. An adhesive layer 410 can be distributed about integrated circuit chip 400 and on dielectric layer 326 as shown in FIG. 10 and handle wafer 420 can be adhered to adhesive layer 410. Handle wafer 420 permits fabrication of additional features on a backside of interposer 300 after substrate 100 is thinned and is no longer able to provide structural integrity for support of the attached device layers. Fabricating processes in one embodiment are described further in reference to FIG. 11. Adhesive layer 410 can be a permanent adhesive or a temporary adhesive.

Where adhesive layer 410 is a permanent adhesive layer 410 adhesive layer 410 can remain adhered to dielectric layer 326 through to completion of a fabricated interposer 300 as shown in FIG. 1.

Figure 11:
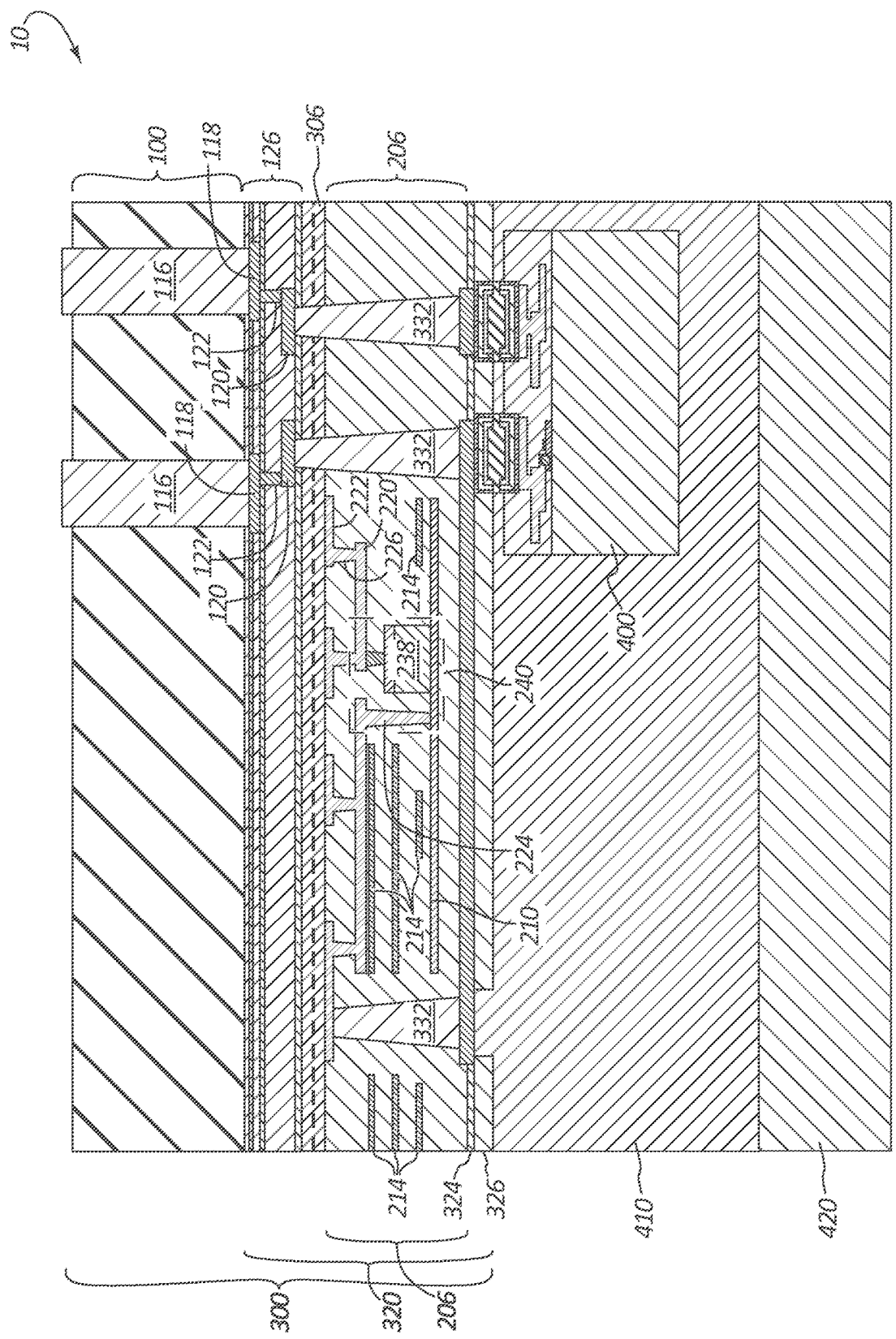
FIG. 11 is a cross sectional side view illustrating the optoelectrical system as shown in FIG. 10 after removal of material of a substrate defining an interposer base.

FIG. 11 illustrates the optoelectrical system 10 as shown in FIG. 10 with additional processing to define interposer backside features. Referring to FIG. 11, material of base interposer substrate 100 can be removed to reveal a portion of vertically extending through vias 116, which vertically extending through vias 116 prior to the reveal depicted in FIG. 11 terminate within substrate 100. Removal of material of substrate 100 can be performed e.g. by way of grinding to a predetermined elevation above a designated final elevation and then further removal can be performed using reactive ion etching (RIE) which can be selective to the material of substrate 100 so that the material of substrate 100 is selectively removed.

Figure 12:
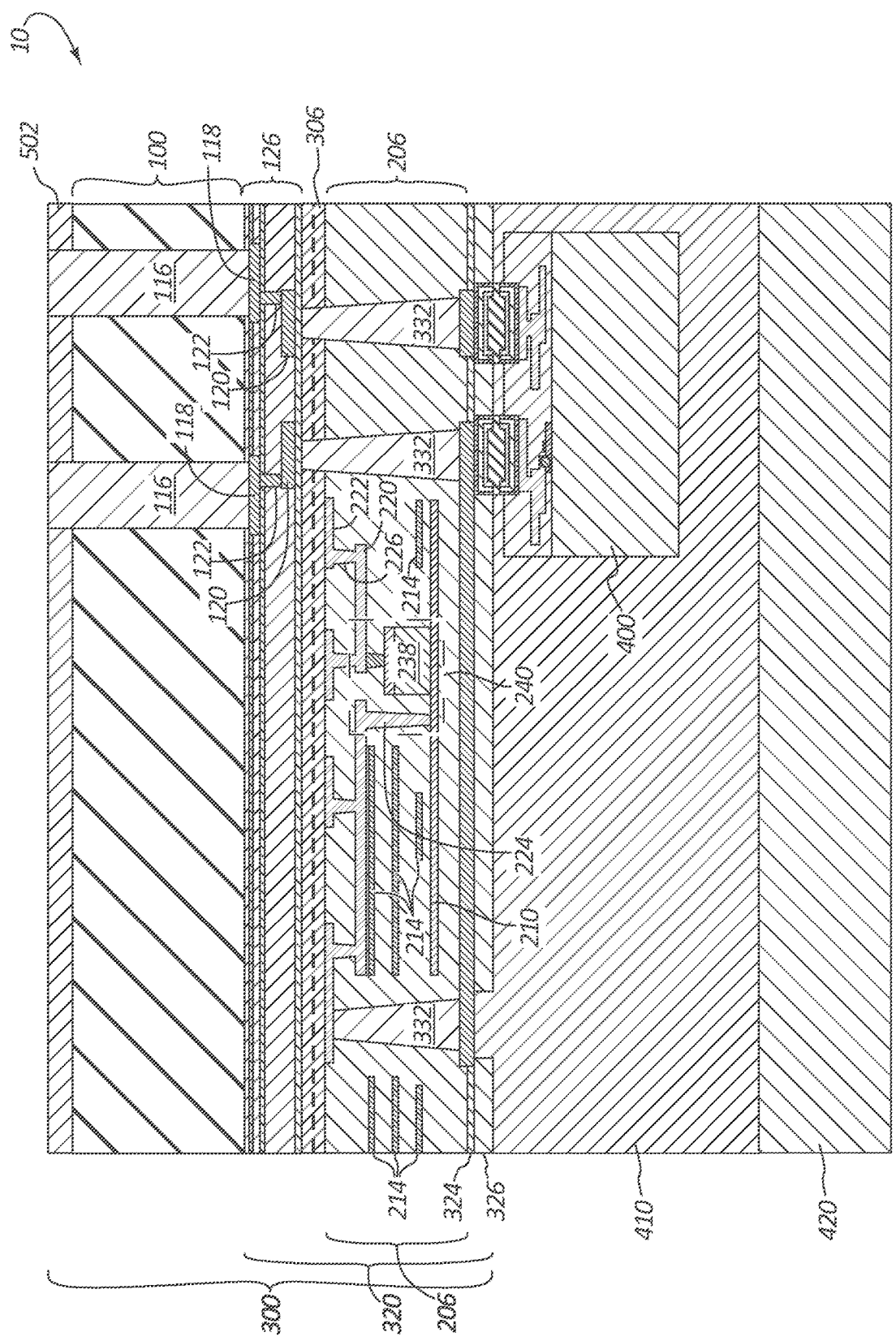
FIG. 12 is a cross sectional side view of the optoelectrical system as shown in FIG. 11 after depositing of a dielectric layer.

FIG. 12 illustrates the optoelectrical system 10 as shown in FIG. 11 after depositing of dielectric layer 502 which in one embodiment can be formed of TEOS. Dielectric layer 502 can be deposited and then planarized to define a smooth surface as shown in FIG. 12.

Figure 13:
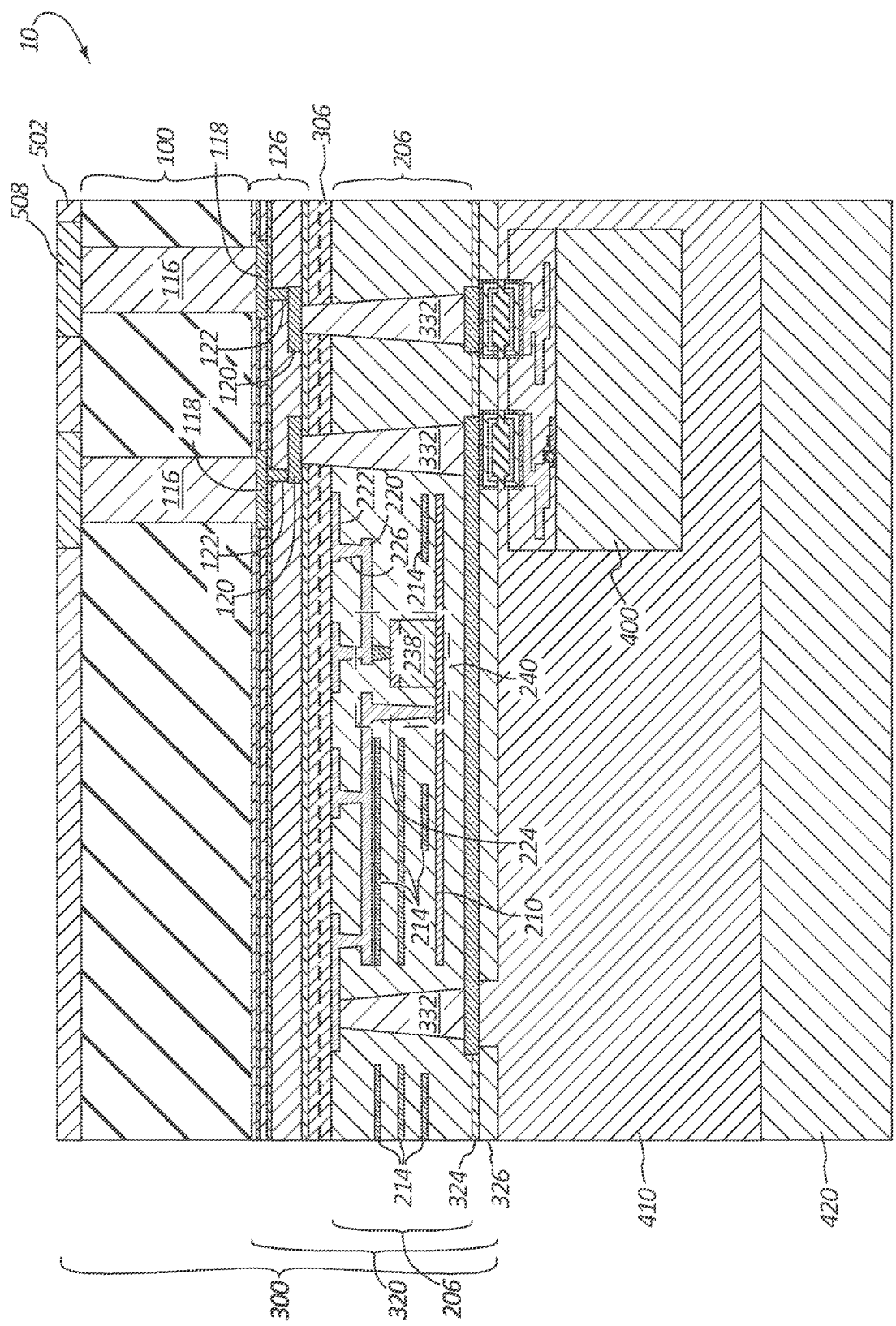
FIG. 13 is a cross sectional side view of the optoelectrical system as shown in FIG. 12 in an intermediary stage of fabrication after patterning to define an interposer backside redistribution layer.

FIG. 13 illustrates the optoelectrical system 10 as shown in FIG. 12 after further patterning to fabricate a conductive backside redistribution layer 508. Redistribution layer 508 which can define horizontally extending redistribution wiring can be provided to fan out the contacts defined by vertically extending through vias 116. Redistribution layer 508 can be fabricated by using a damascene process, e.g., by etching of dielectric layer 502 using RIE selective to material of dielectric layer 502 to selectively remove material of dielectric layer 502 and then filling a defined trench with conductive material that defines redistribution layer 508. Referring to FIGS. 11-13 substrate 100 can be grinded to reveal conductive material of through vias 116 and additional patterning can be performed for formation of redistribution layer 508 (FIG. 13). For example a dielectric layer 502 can be deposited on substrate 100 after grinding of substrate planarized to a bottom elevation of through vias 116 in the stage shown in FIG. 12, followed by depositing of redistribution layer 508, masking and etching to remove unwanted material of redistribution layer 508 to define redistribution layer wiring. In one embodiment, a photoresist stencil can be applied and filled with conductive material for formation of redistribution layer 508.

Figure 14:
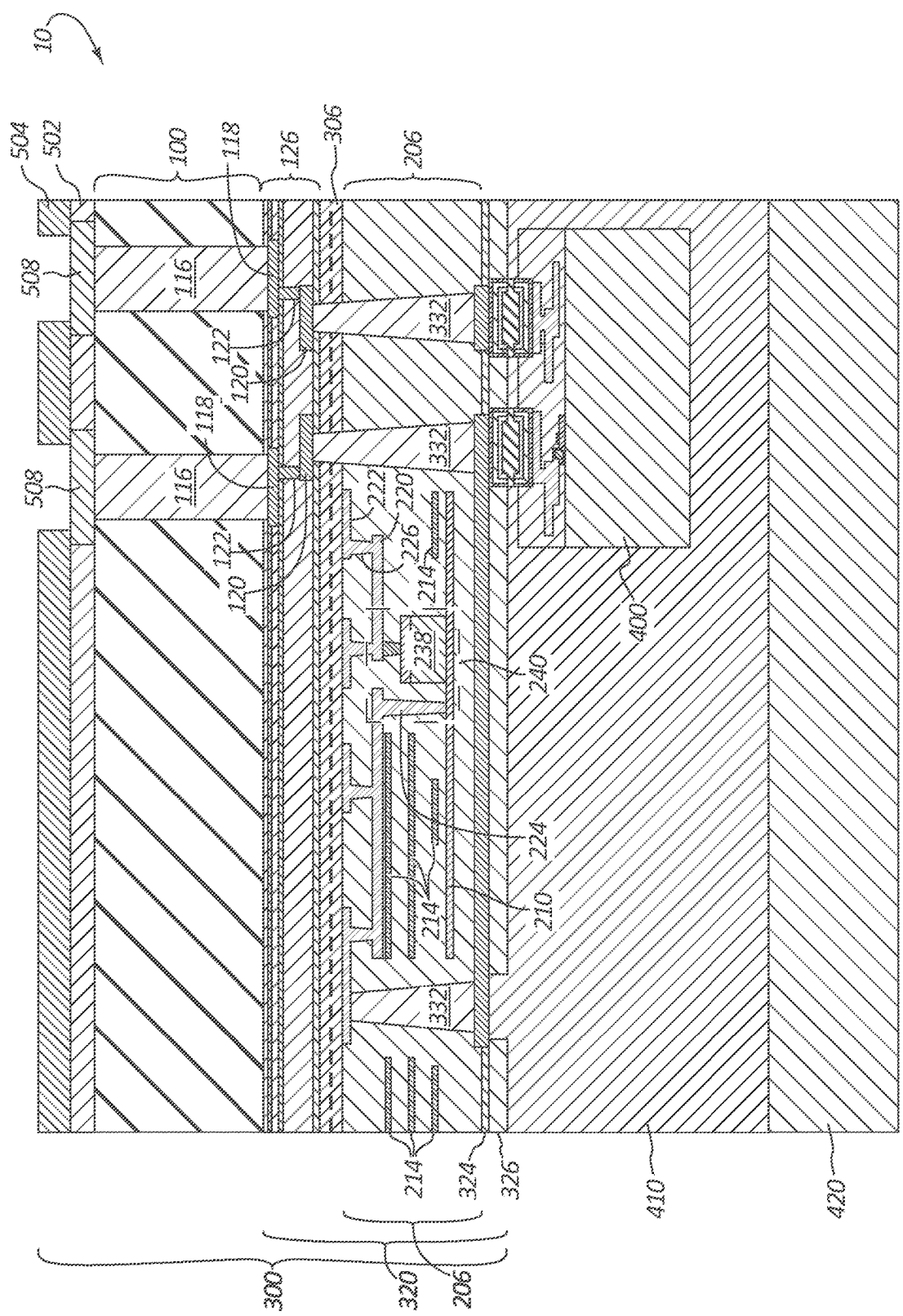
FIG. 14 is a cross sectional side view illustrating the optoelectrical system as shown in FIG. 13 in an intermediary stage of fabrication after depositing of a dielectric layer which can be a dielectric passivation layer.

FIG. 14 illustrates optoelectrical system 10 as shown in FIG. 13 after depositing a dielectric layer 504 which can be a dielectric passivation layer and then patterning of dielectric layer 504 to define trenches to expose redistribution layer 508 in preparation for, and facilitating the selective application under bump metallization pads. Referring to FIG. 14 there is illustrated depositing of dielectric layer 504, then recessing that dielectric layer 504 in areas for accommodated of under bump metallization formations provided by under bump metallization pads as are set forth in FIG. 15.

Figure 15:
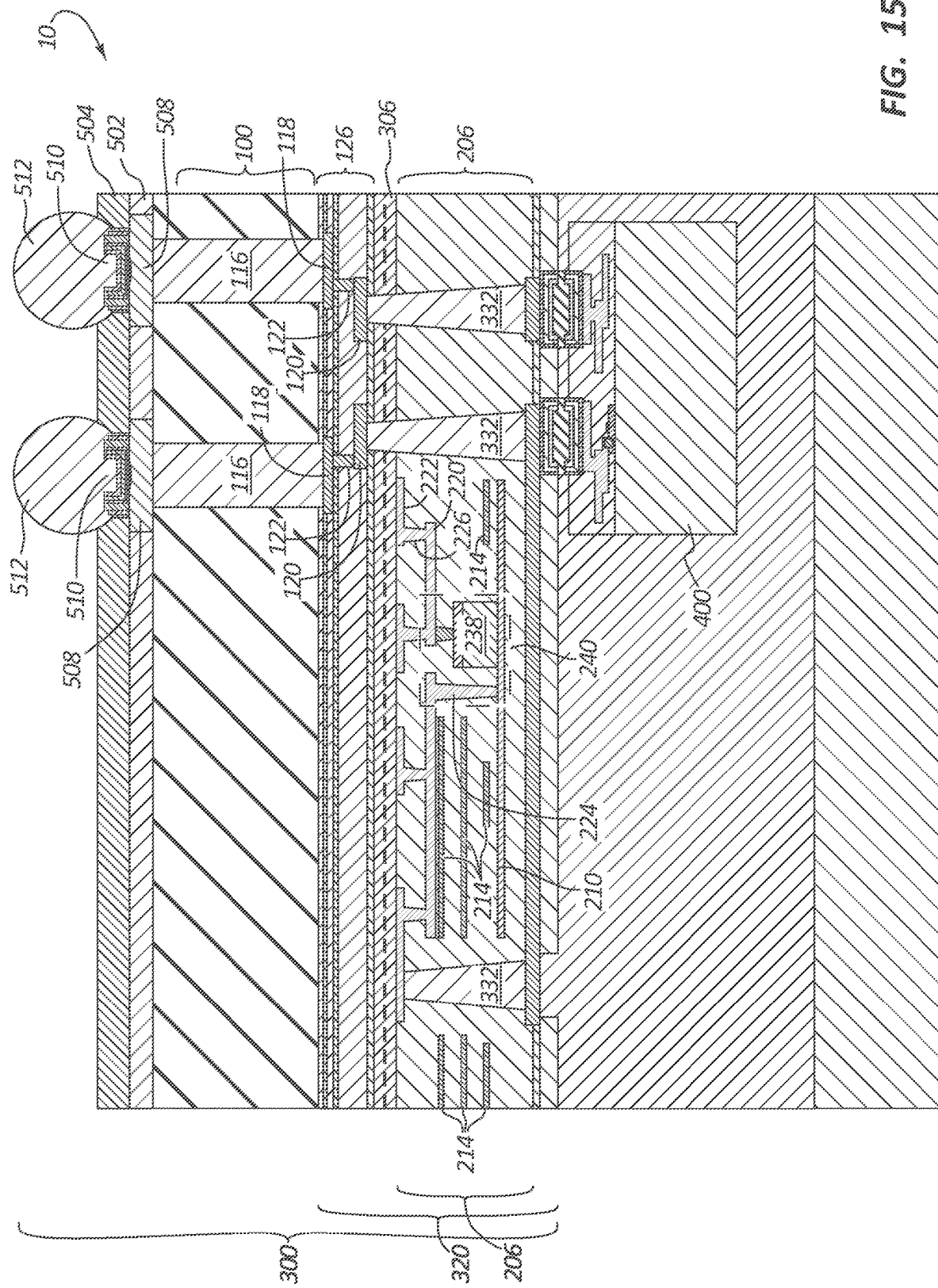
FIG. 15 is a cross sectional side view of the optoelectrical system as shown in FIG. 14 after further patterning to define under bump metallization formations and fabricating solder bumps within the under bump metallization formations.

FIG. 15 illustrates the optoelectrical system 10 as shown in FIG. 14 after further patterning to define under bump metallization formation 510 specifically in exposed areas of dielectric layer 504 to provide electrical connectivity to redistribution layer 508. On fabrication of under bump metallization formations 510 solder bumps 512 can be formed within respective under bump metallization formations 510.

For the fabrication of the fabricated interposer 300 as shown in FIG. 1, an interposer base structure (FIG. 2) can be separately fabricated relative to a photonics structure (FIG. 3). The interposer base structure can be fabricated using a first wafer having a first substrate 100 and a photonics structure (FIG. 3) can be fabricated using a second wafer having a second substrate 200. After separate fabrication of an interposer base structure (FIG. 2) and a photonics structure (FIG. 3), the two wafer built structures can be bonded together using a low temperature oxide fusion bonding process. On the performing of a low temperature oxide bond process a bond layer 306 can be defined between an interposer base structure and a photonics structure, and specifically in one embodiment between an interposer base dielectric stack 126 and a photonic device dielectric stack 206. The resulting interposer 300 as shown in FIG. 1 resulting after further fabrication processing, can feature backside to frontside electrical connectivity e.g. as provided by through vias 116 extending through base interposer substrate 100 being associated to respective through vias 332 extending through photonics device dielectric stack 206.

The optoelectrical system 10 as shown in FIG. 1 having interposer 300 can be connected to an understructure e.g. by way of connection of solder bumps 512 of interposer 300 to UBM formations of the understructure (not shown). The understructure to which the optoelectrical system 10 of FIG. 1 can be attached can be provided e.g. by a printed circuit board or can alternatively be provided e.g. by a ball grid array or an interposer.

In an alternative embodiment, interposer 300 can be entirely fabricated using a single wafer. For example a structure having the components of an interposer base structure as shown in FIG. 2 can be fabricated. Then, a structure having one or more photonics device components can be built on top of the structure as shown in FIG. 2. Finally, large scale through vias can be fabricated to extend through an interposer having photonics features e.g. one or more photonics device to provide backside to frontside electrical connectivity. While the described alternative approach can feature advantages, embodiment herein recognize problems with the approach of the described alternative embodiment. For example, large scale through vias which would extend through a base interposer substrate such as substrate 100 and through elevations of photonics devices according to the alternative embodiment would be expected to consume significant real estate of a photonics device build area thereby limiting a number and size of photonics devices that can be fabricated.

In one aspect as set forth herein referring to FIG. 1, vertically extending through vias 332 which can be provided as photonics structure through vias can be proportioned to have sizes in one embodiment that are a fraction of the size of corresponding vertically extending through vias 116 extending though base interposer substrate 100. In one embodiment vertically extending through vias 332 which can be provided as photonics structure through vias can be proportioned to have a size that is 0.5 or less the size of corresponding through vias 116 extending though base interposer substrate 100. In one embodiment, vertically extending through vias 332 which can be provided as photonics structure through vias can be proportioned to have a size that is 0.25 or less the size of corresponding through vias 116 extending though base interposer substrate 100. In one embodiment, vertically extending through vias 332 which can be provided as photonics structure through vias can be proportioned to have a size that is 0.10 or less the size of corresponding through vias 116 extending though base interposer substrate 100. Size as set forth hereinabove in this paragraph refers to one or more of a diameter, a height, or a volume.

In one example, through vias 332 can have dimensions of about 1.0 microns diameter by 7.0 microns height and through vias 116 can have dimensions of about 10 micron diameter by 100 microns height. In one embodiment vertically extending through vias 116 and vertically extending through via 332 can be differently dimensioned but can have common aspect ratios, e.g. each can have a 10×1 aspect ratio, e.g. vertically extending through vias 332 can be sized to a dimensions of about 0.7 microns×7.0 microns and vertically extending through vias 116 can be sized to dimensions of about 10.0 microns×100 microns. Providing through vias 332 to be dimensionally smaller facilitates fabrication of additional and larger scale photonics devices within photonics device dielectric stack 206. Providing through vias 332 to carry one or more of control, logic and/or power signals rather than contact vias such a vias 226 can help avoid various electrical problems such as involving unwanted voltage drops and stray capacitance generation.

Fabrication methods set forth herein can facilitate providing of sets of interposers 300 having differentiated substrates. Using methods herein a first set of one or more interposers can be fabricated having substrates of a first material and a second set of one or more interposers can fabricated having substrates. There is set forth herein building an interposer base structure on a first wafer defining a first substrate; building a photonics structure on a second wafer defining a second substrate; and bonding the photonics structure to the interposer base structure to define an interposer having the interposer base structure and one or more photonics device fabricated within the photonics device dielectric stack. In one embodiment the method can be modified so that the building interposer base structure can be repeated to build a second base structure using a second first wafer having a substrate of a material different from a substrate material of the first wafer. The method can be further modified by repeating the building a photonics structure to build a second photonics structure using an additional second wafer. The method can be further modified by bonding the second photonics structure to the second base interposer structure. There is set forth herein, according to one embodiment, an optoelectrical system comprising: a first structure defining an interposer base structure and having a substrate, an interposer base dielectric stack and interposer base structure through vias extending through the substrate; a second structure defining a photonics structure and having a photonics device integrated into a photonics device dielectric stack of the second structure, wherein the second structure is bonded to the interposer base dielectric stack of the first structure; and a conductive path for supplying an input voltage to the photonics device, wherein the conductive path comprises a base structure through via of the interposer base structure through vias extending through the substrate and a photonics structure through via of the second structure, the photonics structure through via extending through the photonics device dielectric stack of the second structure, wherein a top elevation metallization layer of the interposer base dielectric stack is defined by horizontal wiring. There is set forth herein, according to one embodiment, an optoelectrical system comprising: a first structure defining an interposer base structure and having a substrate, an interposer base dielectric stack and interposer base structure through vias extending through the substrate; a second structure defining a photonics structure and having a photonics device integrated into a photonics device dielectric stack of the second structure, wherein the second structure is bonded to the interposer base dielectric stack of the first structure; and a conductive path for supplying an input voltage to the photonics device, wherein the conductive path comprises a base structure through via of the interposer base structure through vias extending through the substrate and a photonics structure through via of the second structure, the photonics structure through via extending through the photonics device dielectric stack of the second structure, wherein the photonics structure through via has a bottom elevation defined at a metallization layer of the base structure dielectric stack. There is set forth herein, according to one embodiment, an optoelectrical system comprising: a first structure defining an interposer base structure and having a substrate, an interposer base dielectric stack and interposer base structure through vias extending through the substrate; a second structure defining a photonics structure and having a photonics device integrated into a photonics device dielectric stack of the second structure, wherein the second structure is bonded to the interposer base dielectric stack of the first structure; and a conductive path for supplying an input voltage to the photonics device, wherein the conductive path comprises a base structure through via of the interposer base structure through vias extending through the substrate and a photonics structure through via of the second structure, the photonics structure through via extending through the photonics device dielectric stack of the second structure, wherein a top elevation metallization layer of the base interposer dielectric stack is defined by horizontal wiring, wherein the photonics device through via has a bottom elevation defined at the horizontal wiring of the interposer base dielectric stack.

The terminology used herein is for the purpose of describing particular embodiments only and is not intended to be limiting. As used herein, the singular forms "a," "an," and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include" (and any form of include, such as "includes" and "including"), and "contain" (and any form contain, such as "contains" and "containing") are open-ended linking verbs. As a result, a method or device that "comprises," "has," "includes," or "contains" one or more steps or elements possesses those one or more steps or elements, but is not limited to possessing only those one or more steps or elements. Likewise, a step of a method or an element of a device that "comprises," "has," "includes," or "contains" one or more features possesses those one or more features, but is not limited to possessing only those one or more features. Forms of the term "defined by" encompass relationships where an element is partially defined by as well relationships where an element is entirely defined by. Numerical identifiers herein, e.g. "first" and "second" are arbitrary terms to designate different elements without designating an ordering of elements. Furthermore, a system method or apparatus that is configured in a certain way is configured in at least that way, but may also be configured in ways that are not listed. Furthermore, a system method or apparatus set forth as having a certain number of elements can be practiced with less than or greater than the certain number of elements.

The corresponding structures, materials, acts, and equivalents of all means or step plus function elements in the claims below, if any, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of one or more aspects of the invention and the practical application, and to enable others of ordinary skill in the art to understand one or more aspects of the invention for various embodiments with various modifications as are suited to the particular use contemplated.

What is claimed is:

1. An optoelectrical system comprising:
   a first structure defining an interposer base structure and having a substrate, an interposer base dielectric stack and interposer base structure through vias extending through the substrate;
   a second structure defining a photonics structure and having a photonics device integrated into a photonics device dielectric stack of the second structure, wherein the second structure is bonded to the interposer base dielectric stack of the first structure; and
   a conductive path for supplying an input voltage to the photonics device, wherein the conductive path comprises a base structure through via of the interposer base structure through vias extending through the substrate and a photonics structure through via of the second structure, the photonics structure through via extending through the photonics device dielectric stack of the second structure, wherein the photonics structure through via has a bottom elevation defined at a metallization layer of the base structure dielectric stack.

2. The optoelectrical system of claim 1, wherein the photonics structure through via of the second structure has a smaller diameter than an interposer base structure through via of the interposer base structure through vias.

3. The optoelectrical system of claim 1, wherein the interposer base dielectric stack has integrated therein a contact via and a metallization layer, the contact via and the metallization layer further defining the conductive path for supplying the input voltage to the photonics device.

4. The optoelectrical system of claim 1, wherein the interposer base dielectric stack has integrated therein first horizontal wiring in contact with a through via of the interposer base structure through vias, a contact via contacting the first horizontal wiring, and second horizontal wiring contacting the contact via, the first horizontal wiring, the contact via and the second horizontal wiring further defining the conductive path for supplying the input voltage to the photonics device.

5. The optoelectrical system of claim 1, wherein the photonics device dielectric stack of the second structure has integrated therein horizontal wiring extending at an elevation above a top elevation of the photonics device, the horizontal wiring further defining the conductive path for supplying the input voltage to the photonics device.

6. The optoelectrical system of claim 1,
   wherein the second structure is fusion bonded to the interposer base dielectric stack of the first structure.

7. The optoelectrical system of claim 6, wherein the first structure includes a first through via, wherein the second structure includes a photonics structure through via, wherein the photonics structure through via defines a conductive path with the first through via and includes a diameter smaller than a diameter than an interposer base structure through via of the interposer base structure through vias.

8. The optoelectrical system of claim 6, wherein the first structure includes a contact via extending through the interposer base dielectric stack, wherein the second structure includes a photonics structure through via, wherein the photonics structure through via defines a conductive path with an interposer base structure through via of the interposer base structure through vias and the contact via, the contact via having a smaller diameter than the interposer base structure through via.

9. The optoelectrical system of claim 6, wherein the interposer base dielectric stack has integrated therein horizontal wiring, wherein the second structure includes a photonics structure through via extending through the photonics device dielectric stack that contacts the horizontal wiring of the interposer base dielectric stack, wherein a base interposer through via of the base interposer through vias, the horizontal wiring and the photonics structure through via define a conductive path for supplying an input voltage to the photonics device.

10. The optoelectrical system of claim 6, wherein the interposer base dielectric stack has integrated therein a contact via and a horizontally extending metallization layer and, wherein an interposer base structure through via of the interposer base structure through vias, the contact via and the horizontally extending metallization layer define a conductive path for supplying an input voltage to the photonics device.

11. A method comprising:
fabricating a first wafer built structure using a first wafer, the first wafer built structure defining an interposer base structure and having a plurality of interposer base structure through vias;
fabricating a second wafer built structure using a second wafer, the second wafer built structure defining a photonics structure and having a photonics device integrated into a photonics device dielectric stack of the second wafer built structure; and
wafer scale bonding the second wafer built structure to the first wafer built structure, wherein the method includes, subsequent to the wafer scale bonding the second wafer built structure to the first wafer built structure, forming a via trench in the photonics device dielectric stack of the second wafer built structure, and filling the via trench to form a photonics structure through via, the photonics structure through via defining a conductive path with an interposer base structure through via of the interposer base structure through vias.

12. The method of claim 11, wherein the fabricating the second wafer built structure using a second wafer includes fabricating the second wafer built structure to include a substrate side defined by a substrate of the second wafer and a dielectric side, and wherein the wafer scale bonding the second wafer built structure to the first wafer built structure includes bonding the dielectric side of the second wafer built structure to an interposer base dielectric stack of the first wafer built structure, wherein the method includes, subsequent to the wafer scale bonding, removing the substrate of the second wafer, and forming a photonics through via in the photonics device dielectric stack, the photonics through via connecting to an interposer base structure through via of the interposer base structure through vias.

13. The method of claim 11, wherein a bond layer is formed between the first wafer built structure and the second wafer built structure as a result of the wafer scale bonding, and wherein the method includes, subsequent to the wafer scale bonding the second wafer built structure to the first wafer built structure, forming a via trench extending through the bond layer in the photonics device dielectric stack of the second wafer built structure, and filling the via trench to form a photonics structure through via.

14. The method of claim 11, wherein the method includes, subsequent to the wafer scale bonding the second wafer built structure to the first wafer built structure, creating a photonics structure through via within the photonics device dielectric stack, the photonics structure through via having a diameter smaller than a diameter of an interposer base structure through via of the interposer base structure through vias and forming a conductive path with the interposer base structure through via, the conductive path for supplying an input voltage to the photonics device.

15. The optoelectrical system of claim 1, wherein the conductive path comprises a second photonics structure through via extending through the photonics device dielectric stack of the second structure, and wiring connecting the photonics structure through via of the second structure and the second photonics structure through via of the second structure, wherein each of the photonics structure through via and second photonics structure through via extends through elevations of the photonics device dielectric stack which comprise top and bottom elevations of the photonics device.

16. The optoelectrical system of claim 1, wherein the conductive path comprises a second photonics structure through via extending through the photonics device dielectric stack of the second structure, and wiring extending at an elevation above a top elevation of the photonics device connecting the photonics structure through via of the second structure and the second photonics structure through via of the second structure, and wherein a bottom elevation of the second photonics structure through via is defined at a metallization layer of the photonics device dielectric stack.

17. The optoelectrical system of claim 1, wherein the photonics device dielectric stack is configured to conduct light, by evanescent coupling, between waveguides disposed at different elevations within the photonics device dielectric stack.

18. The optoelectrical system of claim 1, wherein a top elevation metallization layer of the interposer base dielectric stack is defined by horizontal wiring.

19. An optoelectrical system comprising:
a first structure defining an interposer base structure and having a substrate, an interposer base dielectric stack and interposer base structure through vias extending through the substrate;
a second structure defining a photonics structure and having a photonics device integrated into a photonics device dielectric stack of the second structure, wherein the second structure is bonded to the interposer base dielectric stack of the first structure; and
a conductive path for supplying an input voltage to the photonics device, wherein the conductive path comprises a base structure through via of the interposer base structure through vias extending through the substrate and a photonics structure through via of the second structure, the photonics structure through via extending through the photonics device dielectric stack of the second structure, wherein a top elevation metallization layer of the interposer base dielectric stack is defined by horizontal wiring.

20. An optoelectrical system comprising:
a first structure defining an interposer base structure and having a substrate, an interposer base dielectric stack and interposer base structure through vias extending through the substrate;

a second structure defining a photonics structure and having a photonics device integrated into a photonics device dielectric stack of the second structure, wherein the second structure is bonded to the interposer base dielectric stack of the first structure; and a conductive path for supplying an input voltage to the photonics device, wherein the conductive path comprises a base structure through via of the interposer base structure through vias extending through the substrate and a photonics structure through via of the second structure, the photonics structure through via extending through the photonics device dielectric stack of the second structure, wherein the photonics device dielectric stack is configured to conduct light, by evanescent coupling, between waveguides disposed at different elevations within the photonics device dielectric stack.

21. An optoelectrical system comprising:

a first structure defining an interposer base structure and having a substrate, an interposer base dielectric stack and interposer base structure through vias extending through the substrate;

a second structure defining a photonics structure and having a photonics device integrated into a photonics device dielectric stack of the second structure, wherein the second structure is bonded to the interposer base dielectric stack of the first structure; and a conductive path for supplying an input voltage to the photonics device, wherein the conductive path comprises a base structure through via of the interposer base structure through vias extending through the substrate and a photonics structure through via of the second structure, the photonics structure through via extending through the photonics device dielectric stack of the second structure, wherein the conductive path comprises a second photonics structure through via extending through the photonics device dielectric stack of the second structure, and wiring connecting the photonics structure through via of the second structure and the second photonics structure through via of the second structure, wherein each of the photonics structure through via and second photonics structure through via extends through elevations of the photonics device dielectric stack which comprise top and bottom elevations of the photonics device.

* * * * *